US008407018B2

(12) United States Patent
White et al.

(10) Patent No.: US 8,407,018 B2
(45) Date of Patent: Mar. 26, 2013

(54) BATTERY LIFE ESTIMATION

(75) Inventors: Kevin White, Haverhill, MA (US);
Daniel C. Cohen, Newtonville, MA (US)

(73) Assignee: American Power Conversion Corporation, West Kingston, RI (US)

( * ) Notice: Subject to any disclaimer, the term of this patent is extended or adjusted under 35 U.S.C. 154(b) by 494 days.

(21) Appl. No.: 12/410,404

(22) Filed: Mar. 24, 2009

(65) Prior Publication Data
US 2010/0250162 A1    Sep. 30, 2010

(51) Int. Cl.
  G01R 29/08    (2006.01)
  G01R 29/24    (2006.01)
  G01R 3/00     (2006.01)
  G06F 3/01     (2006.01)

(52) U.S. Cl. ............... 702/63; 702/65; 702/79; 702/179

(58) Field of Classification Search .............. 702/62, 702/63, 179, 182, 183, 186, 189; 320/132; 607/29
See application file for complete search history.

(56) References Cited

U.S. PATENT DOCUMENTS

| | | | |
|---|---|---|---|
| 6,545,448 B1 * | 4/2003 | Stanley et al. | 320/132 |
| 6,631,293 B2 * | 10/2003 | Lyden | 607/29 |
| 6,924,622 B1 | 8/2005 | Anbuky et al. | |
| 6,983,212 B2 | 1/2006 | Burns | |
| 7,317,298 B1 | 1/2008 | Burns et al. | |
| 7,423,409 B1 | 9/2008 | Burns et al. | |
| 7,479,764 B1 | 1/2009 | Burns et al. | |
| 7,711,426 B2 * | 5/2010 | Armstrong et al. | 607/29 |
| 7,872,450 B1 | 1/2011 | Cohen et al. | |
| 7,880,438 B1 | 2/2011 | Cohen et al. | |
| 2005/0110466 A1 | 5/2005 | Shoji | |
| 2008/0125987 A1 | 5/2008 | Suzuki et al. | |
| 2009/0037145 A1 | 2/2009 | Suzuki et al. | |

OTHER PUBLICATIONS

International Search Report for International Patent Application No. PCT/US2010/028348, dated Nov. 3, 2010, 3 pages.
International Preliminary Report on Patentability for PCT/US2010/028348, mailed Oct. 6, 2011.

* cited by examiner

*Primary Examiner* — Michael Nghiem
*Assistant Examiner* — Felix Suarez
(74) *Attorney, Agent, or Firm* — Gilman Clark Hunter & Messina LLC

(57) ABSTRACT

A method of estimating battery lifetime includes monitoring a charge characteristic of a battery during a first time period, monitoring an operating condition of the battery, determining a first battery life value for the first time period based on the operating condition of the battery, the charge characteristic, and a duration of the first time period, determining an overall battery life value using the first battery life value and a second battery life value for a second time period, and estimating a remaining battery lifetime for the battery based on the overall battery life value.

21 Claims, 15 Drawing Sheets

BATTERY LIFE ESTIMATION

BACKGROUND

The capacities of batteries in battery-based uninterruptible power supplies (UPSs) vary depending on several factors, including temperature, age, and load. As the batteries age, they are preferably replaced once their capacities drop below desired capacities (e.g., runtimes). Preferably, the batteries are replaced before their diminished capacities affect desired operation of the UPSs, e.g., by relying on a battery with an undesirably-low runtime such that the UPS is unable to provide backup power to a load for a desired amount of time. To determine when a battery's capacity has diminished more than desired before being relied on to power a load, periodic testing may be performed on the battery.

Previously, determining a UPS's battery capacity has involved powering a load with the battery to significantly or fully discharge the battery to determine the battery's capacity. This can take a long time (e.g., 4 hours) and when the battery is significantly or completely depleted, the UPS cannot provide desired/adequate backup power. Oftentimes, this kind of depletion testing is infrequently performed and leads to reporting that a battery needs replacing long after the capacity has degraded to unacceptable levels. In power supplies such as UPS's, this is not acceptable. Previously, deciding when the battery should be considered for replacement or should be discharge tested to verify its actual capacity has been made based primarily or solely on battery age, which ignores other factors affecting age and may lead to either premature or late battery replacement.

SUMMARY

An exemplary method of estimating battery lifetime in accordance with the disclosure includes monitoring a charge characteristic of a battery during a first time period, monitoring an operating condition of the battery, determining a first battery life value for the first time period based on the operating condition of the battery, the charge characteristic, and a duration of the first time period, determining an overall battery life value using the first battery life value and a second battery life value for a second time period, and estimating a remaining battery lifetime for the battery based on the overall battery life value.

Embodiments of such a method may include one or more of the following features. When the first time period is a float time period, the operating condition may be an operating temperature of the battery, the charge characteristic may be a float voltage applied to the battery, and methods may include determining the first battery life value may be based on the duration of the first time period, the operating temperature of the battery during the first time period, and the float voltage. Methods may include determining the first battery life value by determining a float life contribution and scaling the float life contribution to account for a rate of chemical reaction of the battery at the operating temperature. Methods may include adjusting a level of the applied float voltage to compensate for the operating temperature of the battery, and determining the first battery life value may include determining a float life contribution and scaling the float life contribution to account for an adjusted float voltage level applied during the first time period. When the first time period is a float time period, the operating condition of the battery is a discharge of the battery during a discharge in a third time period prior to the first time period, and the charge characteristic is a float voltage applied to the battery, methods may include monitoring discharge of the battery during the third time period, and determining a discharge rate at which the battery was discharged during the third time period, and determining the first battery life value may include determining a float life contribution based on the float voltage and the duration of the first time period, and scaling the float life contribution to account for the battery being discharged at the discharge rate during the third time period. Methods may include reducing an effect that the scaling has on the float life contribution based on an amount of time that the third time period preceded the first time period. When the float life value is a decrement to the overall battery life, scaling the float life decrement may include applying a scale factor to the float life decrement, where a first scale factor for a first discharge rate results in a smaller scaled float life decrement for the first time period than does a second scale factor for a second discharge rate with the first discharge rate being lower than the second discharge rate. When the first time period is a discharge period, the method may include monitoring discharge of the battery during the discharge period, determining, for the discharge period, a rate and/or depth of discharge of the battery, determining an estimated number of discharge cycles based on the discharge rate and/or the depth of discharge, and determining the first battery life value by determining a cycle life contribution for the first time period based on the estimated number of discharge cycles. Methods may include determining a capacity of the battery by performing a state of health test, and adjusting the remaining battery lifetime based on the determined capacity.

An exemplary apparatus for estimating battery lifetime in accordance with the disclosure includes a battery monitor configured to monitor a charge characteristic of a battery during a first time period, a life value module coupled to the battery monitor and configured to monitor an operating condition of the battery, determine a first battery life value for the first time period based on the operating condition of the battery, the charge characteristic, and a duration of the first time period, and determine an overall battery life value using the first battery life value and a second battery life value for a second time period, and a remaining life module coupled to the life value module and configured to estimate a remaining battery lifetime for the battery based on the overall battery life value.

Embodiments of such an apparatus for estimating battery lifetime may include one or more of the following features. When the first time period is a float time period and the life value module is a float life value module, the battery monitor may be configured to monitor a float voltage applied to the battery during the first period, and the float life value module may be configured to monitor the operating temperature of the battery and determine the first battery life value based on the duration of the first time period, the operating temperature of the battery during the first time period, and the float voltage. The float life value module may be configured to determine the first battery life value by determining a float life contribution and scaling the float life contribution to account for a rate of chemical reaction of the battery at the operating temperature. When a level of the applied float voltage is adjusted to compensate for the operating temperature of the battery, the float life value module may be configured to determine the first battery life value by determining a float life contribution and scaling the float life contribution to account for an adjusted float voltage level applied during the first time period. When the first time period is a float time period and the life value module is a float life value module, the battery module may be configured to monitor a float voltage applied to the battery during the first time period, and the float life value module may be configured to monitor discharge of the battery during a third time period prior to the first time period, determine a discharge rate at which the battery was discharged during the third time period, and determine the first battery life value by determining a float life contribution based on the float voltage and the duration of the first time period, and scaling the float life contribution to account for the battery being discharged at the discharge rate during the third time period. The float life module may be configured to reduce an effect that the scaling has on the float life contribution based on an amount of time that the third time period preceded the first time period. The float life value may be a decrement to the overall battery life and the float life module may scale the float life decrement by applying a scale factor to the float life decrement, where a first scale factor for a first discharge rate results in a smaller scaled float life decrement for the first time period than does a second scale factor for a second discharge rate with the first discharge rate being lower than the second discharge rate. When the first time period is a discharge period, and the life value module is a cycle life value module, the battery monitor may monitor discharge of the battery during the discharge period, and the cycle life value module may be configured to determine, for the discharge period, a rate and/or depth of discharge of the battery, determine an estimated number of discharge cycles based on the discharge rate and/or the depth of discharge, and determine the first battery life value by determining a cycle life contribution for the first time period based on the estimated number of discharge cycles. Apparatus may include a state of health module configured to determine a capacity of the battery by performing a state of health test, and the remaining life module may be configured to adjust the remaining battery lifetime based on the determined capacity.

Another exemplary apparatus for estimating battery lifetime in accordance with the disclosure includes a battery monitor configured to monitor a float voltage applied to a battery during a first time period and monitor a charge characteristic of the battery, a float life value module coupled to the battery monitor and configured to monitor an operating condition of the battery, and determine a first float life contribution based on the operating condition of the battery, the float voltage, and a duration of the first time period, and determine an overall float life value using the first float life contribution and a second float life contribution for a second time period, a cycle life value module coupled to the battery module and configure to determine, for a third time period, a rate and/or depth of discharge of the battery, determine an estimated number of discharge cycles based on the discharge rate and/or the depth of discharge, determine a first cycle life contribution for the first time period based on the estimated number of discharge cycles, and determine an overall cycle life value using the first cycle life contribution and a second cycle life contribution for a fourth time period, and a remaining life module coupled to the float life value module and the cycle life value module and configured to estimate a remaining battery lifetime for the battery based on the overall float life value and the overall cycle life value.

Various embodiments discussed herein may provide one or more of the following capabilities. Estimating when a battery should be replaced can be done more robustly. Variations in operating temperature can be taken into account in determining battery lifetime. Rate and/or depth of discharge can be taken into account in determining the effect on battery lifetime.

In the appended figures, similar components and/or features may have the same reference label. Further, various components of the same type may be distinguished by following the reference label by a dash and a second label that distinguishes among the similar components. If only the first reference label is used in the specification, then the description is applicable to any one of the similar components having the same first reference label irrespective of the second reference label.

DETAILED DESCRIPTION

Embodiments provide techniques for estimating the remaining lifetime of a battery. For example, the battery is a backup power source of an uninterruptible power supply (UPS). In the UPS, the battery is periodically subjected to discharge events due to power failures, power spikes and other anomalous power events. In addition, the battery is regularly subjected to recharging events and float charge events throughout the lifetime of the battery. A float charge, also known as a trickle charge, is used to keep the battery charged by applying a voltage that creates a charge current to keep the battery charged. Characteristics of the battery are monitored during discharge and charge cycles and during float charge time periods. Environmental and/or operating conditions during these monitored time periods are also monitored. Each of the charge/discharge cycles and float charge events can affect the lifetime of the battery in different ways. Some charge rates or discharge rates can be more detrimental to the life of a battery than others. The techniques provided herein estimate the effect that individual event occurrences experienced by the battery have on the remaining lifetime of the battery. The techniques consider the effects of the charge characteristics as well as various environmental and/or operating conditions experienced by the battery. Other embodiments are within the scope of the disclosure.

Figure 1:
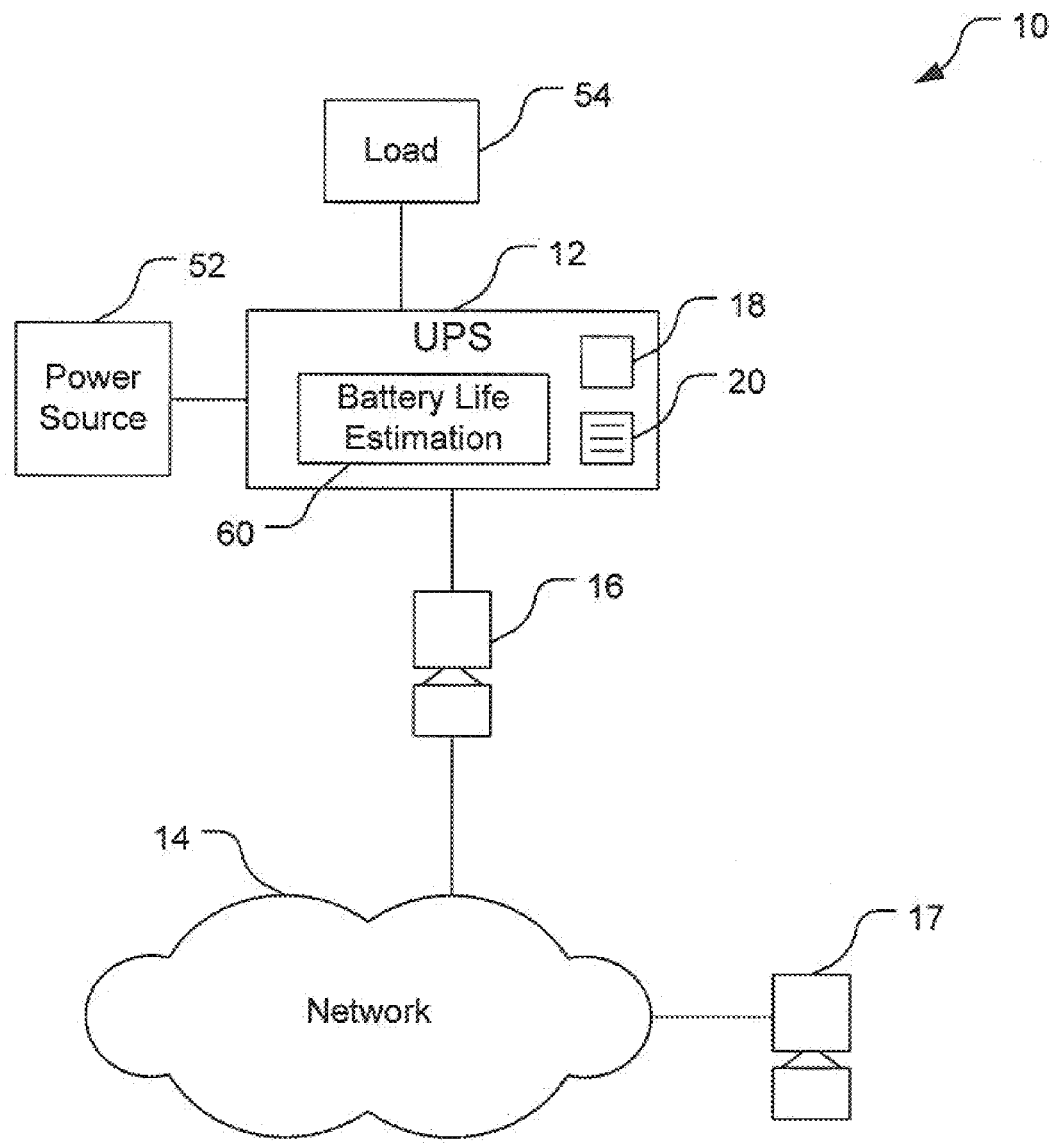
FIG. 1 is a block diagram of a networked uninterruptible power supply system including a battery life estimation system.

Referring to FIG. 1, a system 10 for providing backed-up power to a load 54 and communicating power status includes a UPS 12, a network 14, a computer 16, and a computer 17. The UPS 12 is configured to supply mains power from a power source 52, such as an AC source, or battery power from a battery internal to the UPS 12, to the load 54. Alternatively the power source 52 can be a DC source combined with an AC/DC converter. The power source 52 is a source of electrical power, such as a device or power distribution system that supplies electrical power to an output load or group of loads. Electrical power sources include power distribution systems and other primary or secondary sources of energy such as batteries, chemical fuel cells, solar power or wind power systems, uninterruptible power supplies, generators and alternators.

The UPS 12 can communicate with the computer 16 or directly to the network 14 via various means and protocols such as serial communications. The UPS 12 can provide information to the computer 16 and network 14 regarding the UPS 12, e.g., status of the UPS's internal battery. The UPS 12 includes a battery life estimation system 60 that is used to estimate the remaining lifetime of the internal battery of the UPS. The UPS 12 can provide indications of a bad battery or a battery in danger of going bad, for which replacement is recommended, through various indicators such as a visual-indicator light 18 and/or an audio-indicator speaker 20. The UPS 12 can also send information to the computer 16 indicating that the battery is in need of replacement or soon to be in need of replacement and the computer 16 can process the received information for providing an indication at the computer 16 or to any other equipment connected to the network 14, such as computer 17. Alternatively UPS 12 can connect directly to network 14 and any other equipment connected to it.

Figure 2:
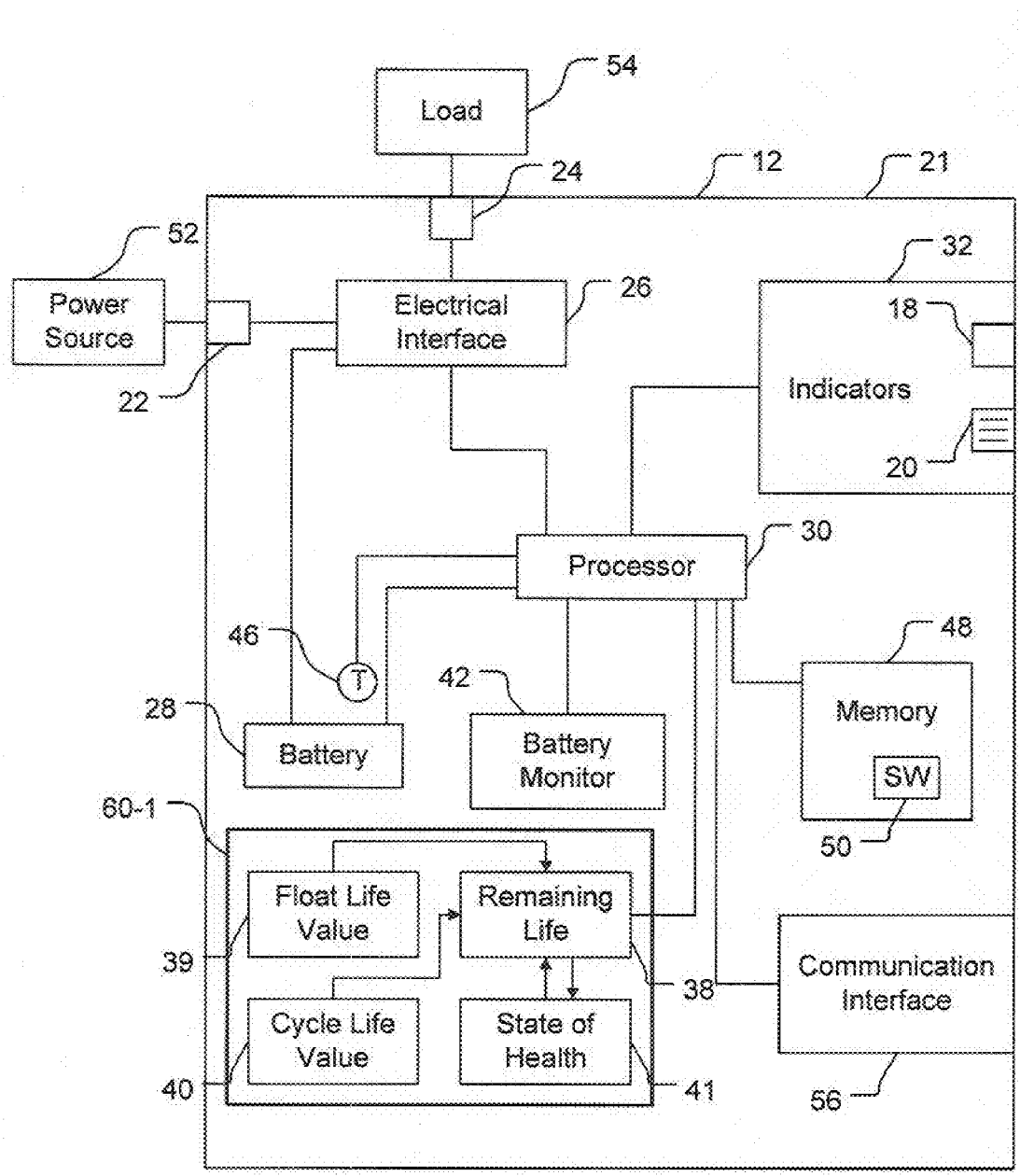
FIG. 2 is a block diagram of an uninterruptible power supply, a power source, and a load of the system in FIG. 1.

Referring also to FIG. 2, the UPS 12 includes a housing 21, a power input 22, a power output 24, electrical interlace circuitry 26, a battery 28, a processor 30, indicators 32 (here the light 18 and the speaker 20), a battery monitor 42, a temperature sensor 46, a memory 48, a communication interface 56 and a battery life estimation subsystem 60-1. The input 22 is configured to connect to the power source 52, receive and convey the received power toward the electrical interface circuitry 26. The electrical interface circuitry 26 is configured to receive power from the input 22, receive DC power from the battery 28, provide a desired AC (or DC) power to the output 24, and provide charging power to the battery 28, as directed by the processor 30. The electrical interface circuitry 26 may or may not alter the received energy before providing it to the output 24. The processor 30 is configured to control the conversion circuitry to regulate the source of power provided to the output 24. The output 24 is configured to connect to, and transfer power to, the load 54. The temperature sensor 46 and the battery monitor 42 are configured to measure the temperature in the vicinity of the battery 28 and the charge characteristics (e.g., discharges, charges and float charges) experienced by the battery 28, respectively, and provide this information to the processor 30. The processor 30 is further configured to send signals to the indicators 32 to control the actuation of the light 18 and the speaker 20 to provide indications that the battery 28 is in need of replacement. The processor 30 can also exchange information between itself and the communication interface 56, e.g., indications of the status of the battery 28, e.g., good, bad, estimated remaining lifetime, etc. The communication interface 56 is configured to connect to the computer 16 and/or network 14 and relay signals to and from the processor 30.

The battery life estimation subsystem 60-1 can be controlled by the processor 30 or can include one or more other processors coupled to the processor 30. The battery life estimation subsystem 60-1 includes a remaining life module 38, a float life value module 39, a cycle life value module 40 and a state of health module 41. The battery life estimation subsystem 60-1 uses operating conditions and charge/discharge characteristics that are received from the temperature sensor 46 and the battery monitor 42 via the processor 30 to estimate a remaining lifetime of the battery. Operating conditions include environmental conditions such as battery operating temperature. Operating conditions also include power anomaly events including blackouts, brownouts, power spikes and the like that cause the UPS 12 to discharge the battery 28 for supplying power to the load 54. Discharge characteristics include discharge rate (e.g., discharge current relative to battery ampere-hour rating), duration of discharge, depth of discharge (e.g., the percent ampere-hours discharged relative to the rated ampere-hours) and battery voltage. Charge characteristics include charge voltage levels and charge profile including float voltage levels and duration, over-voltage charge level and duration, charging disabled periods, final float current, and charged ampere-hours.

The remaining life module 38 receives battery life values from the other modules including the float life value module 39, the cycle life value module 40 and the state of health module 41. The battery life values received from these modules are indicative of an effect that specific events have on the remaining life of the battery. By combining these effects using methods described below, the remaining life module 38 can estimate the remaining lifetime of the battery and keep updating this estimate as new events occur and operating conditions change. The two life value modules monitor different types of events that can affect the lifetime of a battery. The float life value module monitors float charge periods and the cycle life module 40 monitors discharge and charge cycle events.

The float life value module 39 estimates the effect that float charging of the battery has on the lifetime of the battery. It has been recognized that different levels of voltage applied to the battery during float charging periods can affect the lifetime of the battery differently. For example, testing has shown that some batteries tend to have longer lifetimes when charged at lower voltages. It has also been recognized that operating temperature has an effect on the lifetime of the battery. It has also been recognized that when a battery is discharged, and then a float charge is then applied to the battery at a subsequent time period, the lifetime of the battery depends on the rate of the discharge in the previous time period. For example, float life testing of batteries includes periodic discharges to determine the capacity of the battery and therefore determine when the battery is bad. It has been found that in some cases, a battery can be expected to have a longer lifetime if it is discharged at lower rates during the discharge periods. The float life module 39 monitors these operating conditions, float charge voltages and discharge rates, and, using one or more of the methods described below, determines how they effect the lifetime of the battery.

The cycle life value module 40 estimates the effect that discharge and recharge cycles have on the remaining battery lifetime of the battery. The rate of discharge of a battery and/or the depth of discharge of the battery affects the remaining lifetime of the battery. The cycle life value module uses data obtained from battery discharge tests to estimate the expected number of discharge and recharge cycles that a battery can survive in a lifetime based on the rate of discharge and/or the depth of discharge (e.g., depth of discharge as a percentage where 100% is a full discharge of battery rated ampere-hours). By discharging a battery at various rates and to various discharge depths, values of the number of discharges that a battery can be expected to survive in a lifetime can be obtained. Using these data, the cycle life value module 40 can determine the effect that a given discharge and recharge event has on the remaining lifetime of the battery.

The state of health module 41 is used to give a backup indication as to the remaining battery lifetime of a battery. Periodically, the battery can be discharged and the capacity of the battery can be determined. For example, patent application Ser. No. 11/759,890 entitled UPS BATTERY REPLACEMENT describes techniques for determining battery state of health. State of health measurements may be inaccurate until the battery is substantially degraded. When the state of health measurements are more reliable, they are combined with the other battery life estimates to improve accuracy of the remaining battery life estimates.

Figure 3:
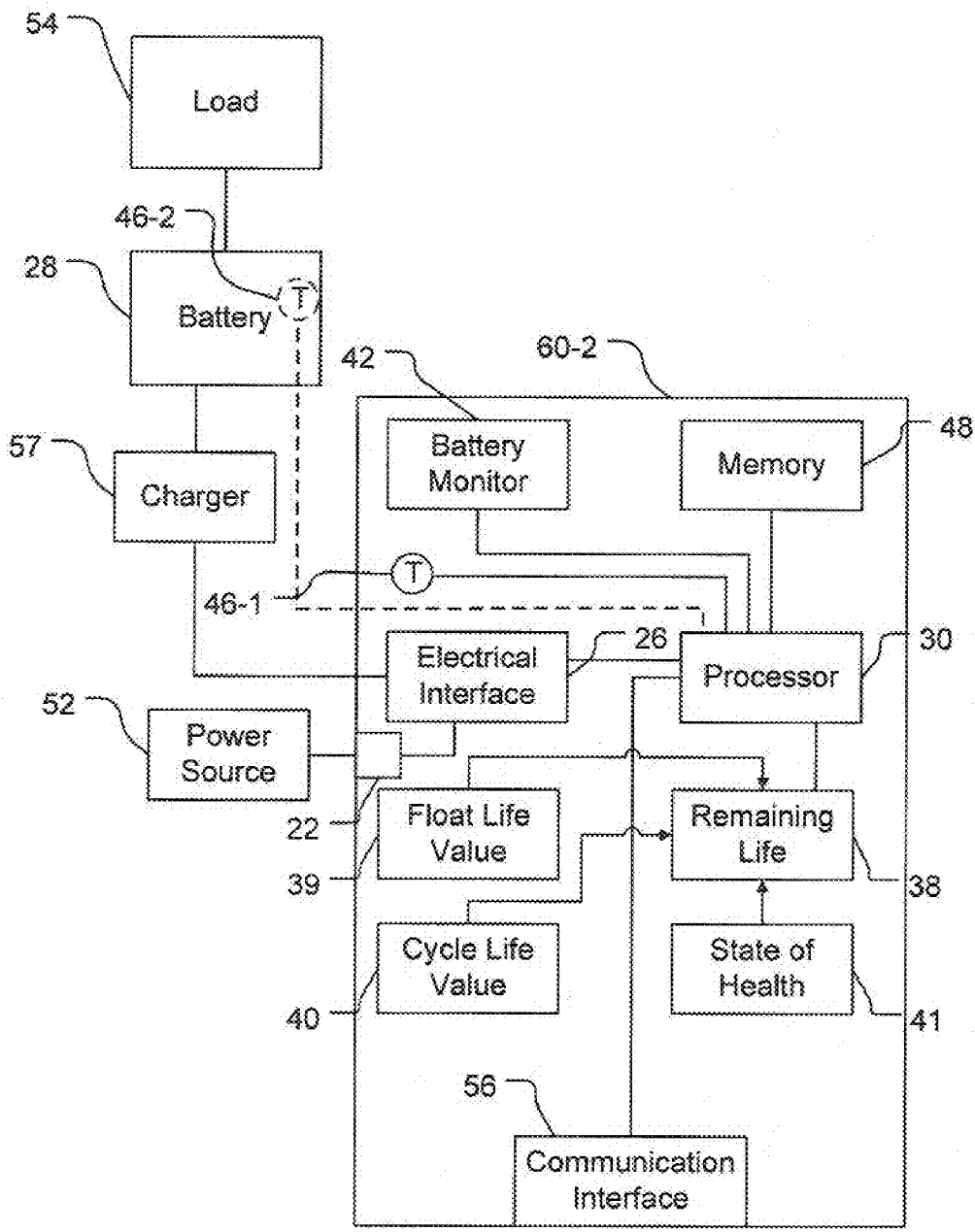
FIG. 3 is a block diagram of an embodiment of a battery life estimation system, a power source, an external battery and a load.

Referring to FIG. 3, a battery life estimation system 60-2 includes many of the same modules as the UPS system 12 of FIG. 2, including the remaining life module 38, the float life value module 39, the cycle life value module 40, the state of health module 41, the battery monitor 42, the memory 48, the electrical interface 26, the processor 30, the communication interface 56 and the input 22 coupled to the external power source 52. The electrical interface circuitry 26 is coupled to an external charger 57 which is connected to an external battery 28 that is coupled to supply power to the load 54. The load 54 could be a UPS or any other electronic device that draws power from the battery 28. The external charger 57 supplies power to the battery for charging. The external charger 57 can be omitted. The electrical interface 26 may be configured to supply power to the external battery 28 for charging, or the load 54 may supply power to charge the battery. The processor 30 is coupled to an internal temperature sensor 46-1. Preferably, the temperature sensor 46-1 is in close proximity to the external battery 28 such that the temperatures obtained from the temperature sensor 46-1 are indicative of the operating temperature of the battery 46-1. Alternatively, the processor 30 is coupled to a temperature sensor 46-2 that is internal to or attached to the battery 28. The functions performed by the modules of the battery life estimation system 60-2 are similar to those discussed above in reference to the UPS 12 of FIG. 2 that included the internal battery life estimation subsystem 60-1.

Figure 4:
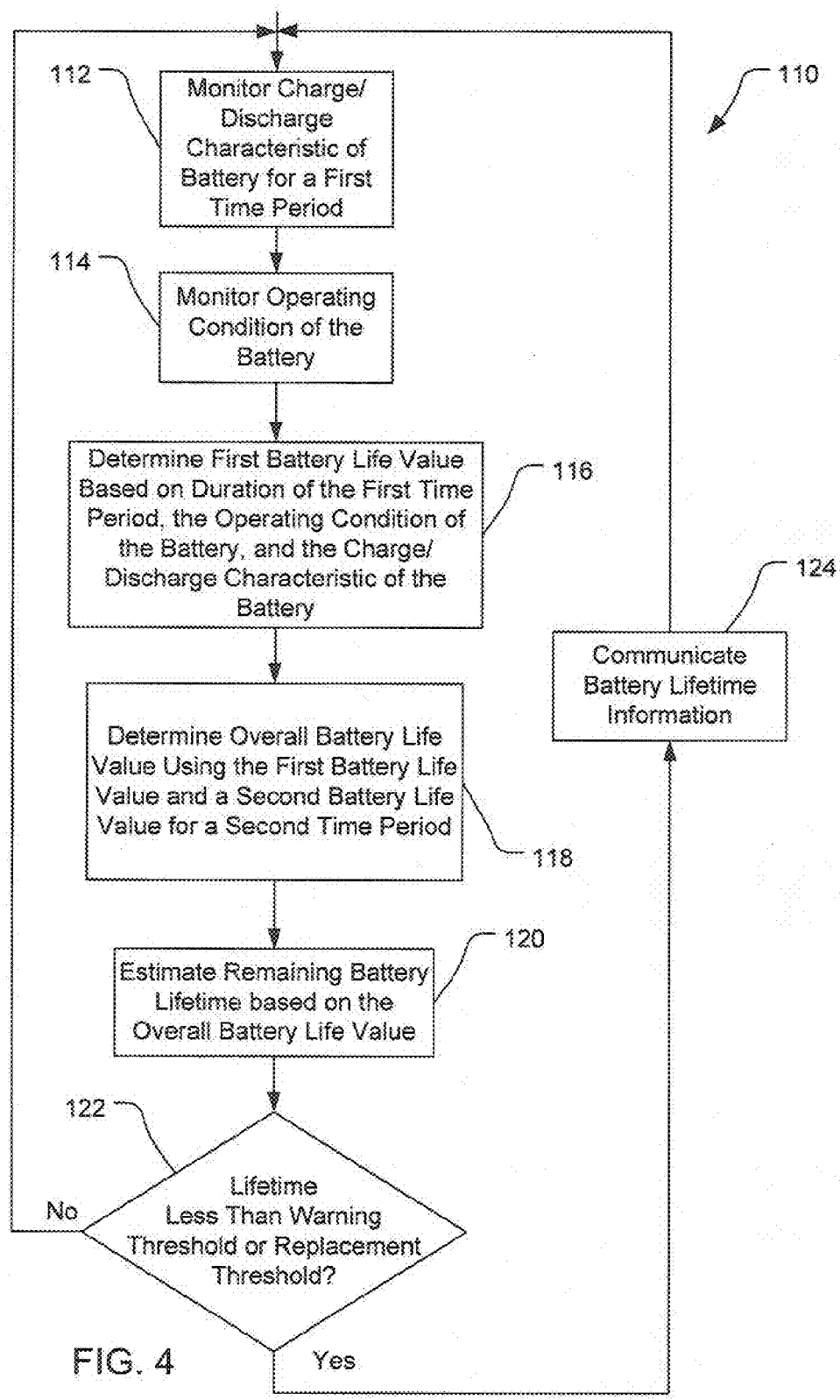
FIG. 4 is a flowchart of a process of determining a remaining lifetime of a battery of FIGS. 1-3.

Referring to FIG. 4, a process 110 for determining a remaining lifetime of a battery in the systems of FIGS. 1-3 includes the stages shown. The process 110 is exemplary only and not limiting. The process 110 may be modified, e.g., by adding, removing, or rearranging the stages shown. The process 110 is a general process for determining the remaining life of the battery. More details of example calculations are discussed below in reference to FIGS. 5-7. At stage 112, the battery monitor 42 monitors one or more charge and/or discharge characteristics of the battery for a first time period. The charge/discharge characteristics include a float voltage applied to the battery during a float time period. The charge/discharge characteristics could also include a rate of discharge and depth of discharge of a discharge event.

In some embodiments, elements of the battery life estimation system 60 (e.g., the battery monitor 42 and/or the temperature sensor 46) are located within an intelligent battery module. There is communication between the battery monitor 42 in the intelligent battery module and processor 30, for communicating temperature, voltage, current, etc. Battery systems can include multiple intelligent battery modules and, when the charge/discharge information is available, the battery life estimation algorithm is applied separately to each of the battery modules, not just the entire battery system. Individual battery modules can be monitored and replaced individually.

At stage 114, one or more of the life value modules, i.e., the float life value module 39 or the cycle life value module 40, monitors one or more operating conditions of the battery. The operating condition(s) of the battery that is (are) monitored at stage 114 depends (depend) on what type of battery event(s) is (are) being monitored. For events involving float time periods, the operating condition can be an operating temperature of the battery during the float time period, or a discharge event that occurred prior to the float time period. For events involving discharge cycle, the operating condition is the discharge event and the discharge characteristics are the rate and depth of the discharge event.

At stage 116, one or more of the life value modules determines a first battery life value that the battery experienced during the first time period. Preferably the battery life value is a measure of a decrement to battery life that the event caused. The battery life value calculations are based on the duration of the first time period of the event, the operating condition(s) that the battery experienced, and the charge or discharge characteristic(s) that the battery experienced during the first time period. Details for determining the different float and cycle life values are discussed below in reference to FIGS. 5-7.

At stage 118, one or more of the life value modules determines an overall battery life value using, e.g., combining, the first battery life value that was determined at stage 116 and a second battery life value for a second time period, e.g., a second time period prior to the first time period. Preferably, the second battery life value includes all the past float life decrements determined by the float life value module 39 for cases where the event of the first time period is a float charge time period. For cases where the event of the first time period is a discharge cycle, the second battery life value includes all the past cycle life decrements.

At stage 120, the remaining life value module 38 estimates a remaining battery lifetime based on the overall battery life value. The overall battery life can include the effects of both float charge time periods and discharge cycle time periods. Preferably, the remaining battery lifetime takes into account a rate at which the battery lifetime decrements are accumulating and an estimated overall lifetime of the battery. For example, assuming that the estimated lifetime of the battery is 5 years and the first battery life value determined at stage 116 indicates that 20% of the battery life has been used up in 6 months, then at this rate, the battery will only have an estimated remaining lifetime of 30 months or 2.5 years. This is a simplification, but is indicative of one method of determining the remaining lifetime at stage 120. Details of other methods of estimating remaining battery lifetime are discussed below.

Upon estimating the remaining battery lifetime at stage 120, the process 110 continues at stage 122 where the remaining life module 38 determines if the remaining lifetime is below one or more threshold levels, e.g., a warning level and/or an immediate replacement threshold level. If it is determined at stage 122 that the battery lifetime is less than one of these levels, then the process 110 continues to stage 124 where the remaining life module 38 communicates the battery lifetime information to the communication interface 56 and/or the indicators 32. For example, the indicator light 18 could flash indicating a warning that the battery should be replaced soon, or remain on constantly if the battery needs immediate replacement. Alternatively, the speaker 20 could sound an alarm if the battery is in need of immediate replacement. If it is determined at stage 122 that the battery lifetime is greater than the threshold levels, then the process 110 continues back to continue the functions of stages 112-122.

Figure 5:
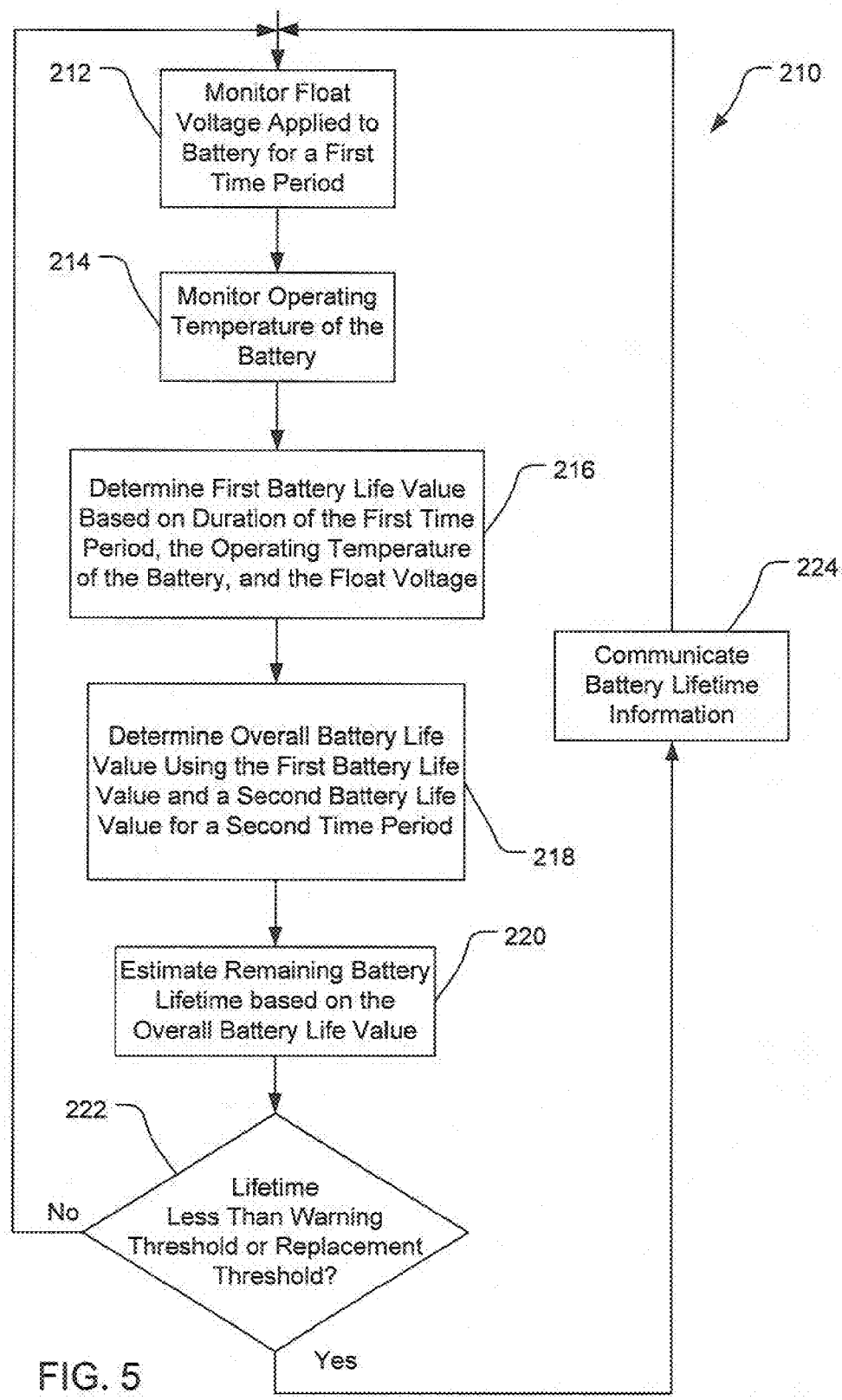
FIG. 5 is a flowchart of another process of determining a remaining lifetime of a battery of FIGS. 1-3.
Figure 6:
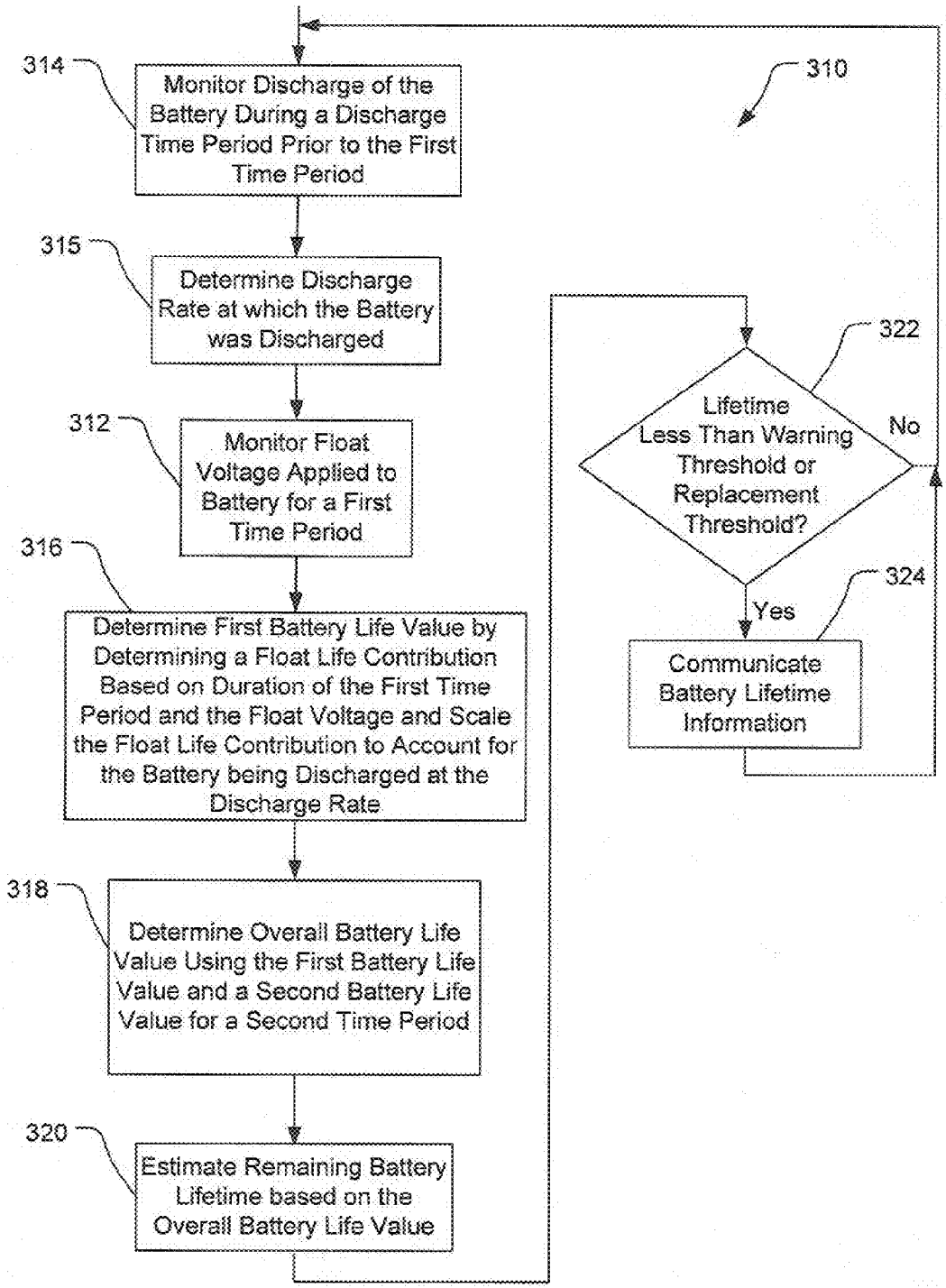
FIG. 6 is a flowchart of another process of determining a remaining lifetime of a battery of FIGS. 1-3.
Figure 7:
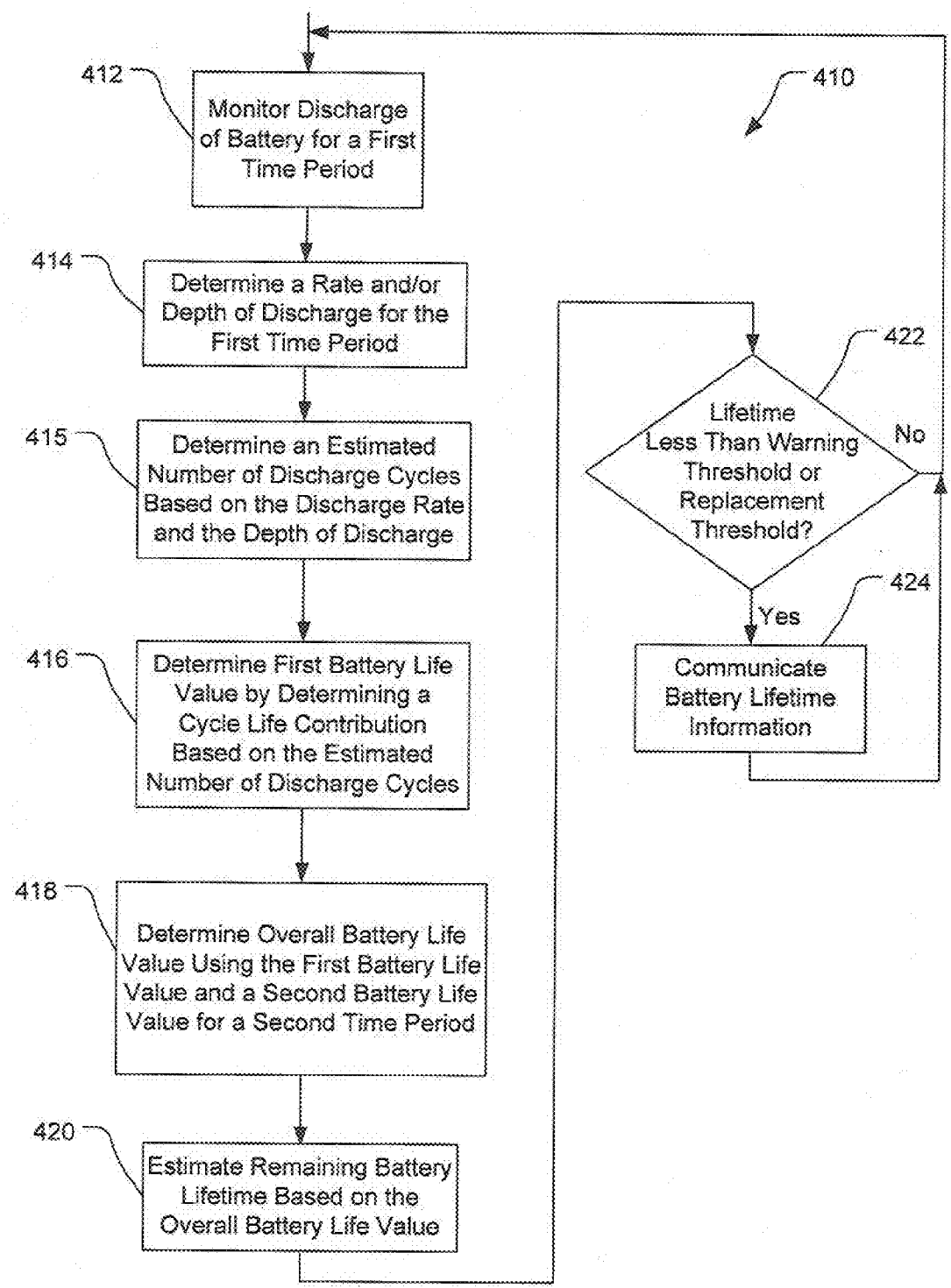
FIG. 7 is a flowchart of another process of determining a remaining lifetime of a battery of FIGS. 1-3.

FIGS. 5-7 show flowcharts of examples of the processes where the general functions of some of the stages of process 110 are replaced with specific examples. Referring to FIG. 5, a process 210 for determining a remaining lifetime of a battery in the systems of FIGS. 1-3 includes the stages shown. The process 210 is exemplary only and not limiting. The process 210 may be modified, e.g., by adding, removing, or rearranging the stages shown. The process 210 monitors float charge time periods and determines battery life values representing decrements in battery life due to the float charge applied to the battery and compensates for the operating temperature of the battery. At stage 212 the battery monitor 42 monitors a float voltage applied to the battery during a first time period. The first time period can be a periodic time period such as, for example, hourly, daily, weekly, monthly etc., for which the float voltage is being applied. Alternatively, the first time period can be the length of an entire time period during which the float voltage is applied and where no other events, e.g., battery discharges, have occurred. The float voltage can be an average float voltage applied during the first time period. The float voltage can also be a single reading taken during the first time period if the float voltage does not vary significantly.

At stage 214, the float life value module 39 monitors an operating temperature of the battery during the first time. The operating temperature is obtained from one of the temperature sensors 46 of FIGS. 2 and 3. The temperature sensor can be the temperature sensor 46-1 internal to the battery life estimation system 60-2 of FIG. 3, or the temperature sensor 46-2 internal to the battery. Preferably, the operating temperature is an average operating temperature of the battery over the first time period. The float life value module 39 receives periodic, e.g., hourly, temperature measurements from the temperature sensor 46. These periodic temperature measurements are stored in memory and the average temperature is calculated for the first time period. Alternatively, the float life module 39 can use a single periodic temperature reading that is taken during a periodic first time period, e.g., hourly.

The monitoring at stages 212 and 214 continues until the first time period ends. The first time period could end when another event ends the float charge period, e.g., a discharge of the battery, or when the periodic time period ends. Upon completion of the first time period, the process 210 continues to stage 216, where the float life value module 39 determines the first battery life value based on the duration of the first time period, the operating temperature of the battery during the first time period and the float voltage applied during the first time period.

The float life value is partially based on an expected age of a battery that is charged at a baseline temperature and at a chosen float voltage. Battery manufacturers do testing to determine an expected age of a battery that is float charged at various voltages. The life expectancy of a battery varies based on the applied float voltage. Typically, the higher the float voltage, the shorter the life expectancy. Preferably, test data is available that provides life expectancy for batteries charged at a variety of float voltage levels. However, for some applications, e.g., where float voltage varies insignificantly, a single life expectancy value could be used. The life expectancy of a battery is usually computed for a baseline temperature, e.g., 25° C.

The float life value determined at stage 216 is also scaled based on the operating temperature that the battery experienced during the first time period. As predicted by the Arrhenius function, chemical reactions approximately double in intensity for every 10° C. over a baseline temperature. This means that a battery that has a life expectancy of 5 years when float charged at a baseline temperature of 25° C. is expected to have a lifetime of 2.5 years when float charged at 35° C. throughout its lifetime. Therefore, the baseline float life value determined from battery test data at the baseline temperature can be scaled to take into account the difference between the operating temperature of the battery and the baseline temperature.

For example, given that a battery has an expected lifetime represented by "EL" at a baseline temperature, e.g., 25° C., for a given float voltage level applied during the first time period, the temperature compensated lifetime (TCL) for the battery operating at a temperature BT can be estimated by the following equation:

$$TCL = EL/2^{[(BT-25° C.)/10]} \quad (1)$$

Preferably, the float life value determined at block 216 is in the form of a decrement to the EL value on a percentage basis. By dividing the length of time of the first time period for which the float voltage is applied by the TCL of equation 1, an estimated percentage of battery life decrement can be obtained. Given that the first time period is $\Delta T$ days, and the EL of the battery is in years, a float life decrement ($\Delta FL$), that represents a percentage of battery life, can be obtained by the following equation:

$$\Delta FL = \{\Delta T/[365*EL/2^{[(BT-25° C.)/10]}]\}*100\% \quad (2)$$

At block 218, the float life module 39 combines the float life decrement $\Delta FL$ determined at stage 216 with a second float life value for a second time period, e.g., the previously determined and accumulated float life decrements for time periods prior to the first time period. The relationship of Equation (2) is accurate only if the battery has experienced little or no change in temperature BT for the duration of the float time period $\Delta T$. If a battery experiences temperature change, a new float time period should be started for the new battery temperature BT. The float life decrements are accumulated to arrive at an overall battery life value at stage 218. The overall battery life value determined at stage 218 is then used to estimate the battery lifetime at stage 220. The remaining battery lifetime can be estimated based on the overall battery life value determined at stage 218 and on the rate of change that the float life decrement has experienced (e.g., an average rate of change for the entire history of the battery or for a recent portion of the battery history). For example, if the EL of a battery is 5 years and the overall battery life value, i.e., the accumulated float life decrements, determined at stage 218 is 50%, then there will be 50% life left. If, the float life decrements for the previous six months have used up 20% of the battery life, which equates to a decrement rate of 40% of battery life per year, then the remaining battery lifetime is estimated to be 1.25 years or fifteen months (50% battery life divided by a decrement rate of 40% of battery life per year equals 1.25 years). Preferably, however, other battery life value components, e.g. cycle life decrements and other float life decrements, are included in the battery lifetime estimation as will be discussed below. The functions performed at stages 222 and 224 are the same as discussed above in reference to FIG. 4.

In some battery charging equipment, the float voltage is varied in order to partially compensate for higher operating temperatures. The float voltage can be lowered at higher temperatures to compensate for some of the increased decrement to battery life experienced at higher temperatures. The EL value used in equation 2 could be based on the float voltage level that was applied in order to compensate for the temperature rise. Alternatively, in cases where the EL value is based on a single baseline float voltage and a single baseline temperature, a scale factor can be computed to compensate for the float voltage compensation.

Figure 10:
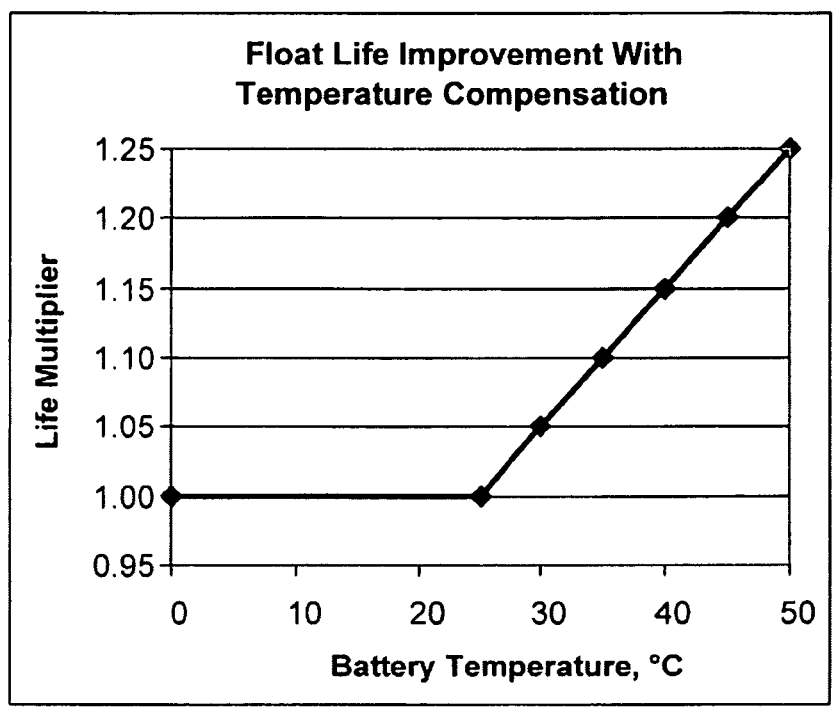
FIG. 10 is a graph of a life multiplier function used to compensate for battery operating temperature.

Referring to FIG. 10, a float life improvement scale factor varies with battery temperature, and this can be used in cases where float voltage is varied to compensate for temperature. This is an example for one temperature compensation algorithm and other temperature compensation algorithms could result in different functions. In the example shown, the float voltage at temperatures of 25° C. and below is the baseline float voltage level and the float life multiplier (LM) is equal to one. As temperatures increase up to about 45° C. the float voltage is decreased which results in longer float life estimates. A typical rate of decrease in float voltage is about 3 mV per ° C., per 2 V nominal battery cell. In the example shown, the LM value linearly increases from 1.0 at 25° C. to 1.2 at 45° C. This is an example and may not be representative of actual batteries and actual algorithms. Curves similar to that in FIG. 10 can be obtained through battery float life testing.

The LM value is used to scale the float life decrement given by equation 2 to reflect the float voltage level applied at the operating temperature during the first time period. This is affected simply by dividing the ΔFL valued determined at stage 216 using equation 2 by the LM value obtained from a function such as shown in FIG. 10. For example, if the operating temperature during the first period is 30° C. and the baseline ΔFL is 5%, then the scaled ΔFL would be 5/1.05 or about 4.76%.

Float life values can also be affected by past discharge events, as was discussed above. Referring to FIG. 6, a process 310 for determining a remaining lifetime of a battery in the systems of FIGS. 1-3 includes the stages shown. The process 310 is exemplary only and not limiting. The process 310 may be modified, e.g., by adding, removing, or rearranging the stages shown. The process 310 monitors float charge time periods and determines battery life values representing decrements in battery life due to the float charge applied to the battery and compensates for a past discharge event that occurred before the float charge time period.

The process 310 starts at stage 314, where the float life module 39 monitors discharge of the battery during a time period prior to a float charge time period. The float life value module 39 receives data from the battery monitor 42 that is indicative of the discharge event. Preferably, the float life value module 39 receives periodic, e.g., every 1 minute, 5 minutes, 10 minutes, etc., data indicative of the current at which the battery is being discharged.

When the data received from the battery monitor 42 indicates that the discharge event has concluded, the process 310 continues to stage 315 where the float life value module 39 determines the rate at which the battery was discharged. The rate can be an average of the periodic discharge rates monitored at stage 314.

At stage 312, the battery monitor 42 monitors the float voltage applied to the battery during a time period subsequent to the discharge event. Continuing to stage 316, the float life value module 39 determines a first battery life value by determining a baseline float life contribution based on the duration of the first time period and the float voltage applied during the first time period. The baseline float life contribution is preferably determined to be a float life decrement using equation 2 above including temperature scaling. However, the temperature scaling could be omitted.

Figure 11:
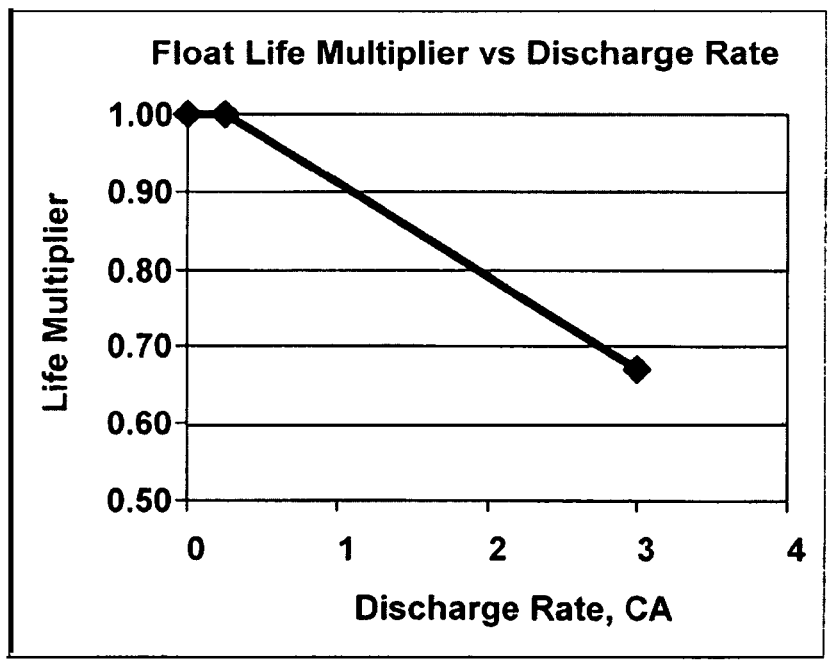
FIG. 11 is a graph of a multiplier function used to compensate for a previous discharge event.

This float life decrement is scaled to account for the battery being discharged at the discharge rate during the previously monitored discharge period. Referring to FIG. 11, an example of a function plotting float life multiplier versus discharge rate is shown. This is an example of a battery where the battery life is decreased at a higher rate during float charge periods that follow high discharge rate periods. The higher the discharge rate was, the smaller the float life multiplier is. In other words, the float life decrement is increased due to increased current draw on the battery, as measured in terms of normalized battery current (CA). CA amperes equal actual amperes divided by C, where C is a dimensionless number equal to the numerical value of rated ampere-hours of the battery. The plot in FIG. 11 shows that from zero CA (no discharge) to about 0.2 CA, the float life multiplier is 1.0. From about 0.2 CA to about 3.0 CA, the float life multiplier decreases from 1.0 to about 0.67.

In this example, the float life multiplier is derived such that the baseline float life value ΔFL, as determined using equation (2), is divided by the float life multiplier to arrive at the scaled float life decrement. For example, if the discharge rate was 1 CA and the baseline ΔFL was determined to be 5%, then the scaled ΔFL would be 5/0.9 or about 5.6%. Alternatively, the float life multiplier could be derived such that ΔFL is multiplied for scaling. The function shown in FIG. 11 is an example and may not be representative of actual batteries. Curves similar to that in FIG. 11 can be obtained through battery float life testing.

When more than one discharge event precedes the first time period where a float voltage is applied, the most recent discharge rate is used in determining the float life multiplier. The float life multiplier of FIG. 11 assumes that the discharges are deep and frequent. When the discharges are infrequent the life multiplier may be scaled back or ignored. For example, if the closest discharge period is older that a threshold number of days, then the float life multiplier is increased towards a value of 1, or alternatively the CA discharge rate used with FIG. 11 can be scaled lower, such that the float life decrement is similarly reduced. For example, if a discharge period is more than 35 days old, then the discharge rate could be multiplied by D/35, where D is the age of the discharge period. The 35 day time period is an example, however, other time periods such as 20, 25, 30, 40, 45, 50, 55, 60 days or more could also be used. Alternatively, a discharge event older than 20, 25, 30, 35, 40, 45, 50, 55, 60 days or more could be ignored. Similarly, if the prior discharge event is a shallow discharge and the discharge ends well before the normal discharge cut-off voltage then the life multiplier is scaled such that effect on the float life decrement is reduced or eliminated. The remaining stages 318-324 of the process 310 are carried out similarly to the stages 118-124 and 218-224 in the processes 110 and 210, respectively, discussed above.

In addition to float charge periods affecting the lifetime of a battery, discharge time periods, or discharge/recharge cycles, also affect the lifetime of a battery. The effect of these cycles on the life of a battery are referred to as cycle life values. Referring to FIG. 7, a process 410 for determining a remaining lifetime of a battery in the systems of FIGS. 1-3 includes the stages shown. The process 410 is exemplary only and not limiting. The process 410 may be modified, e.g., by adding, removing, or rearranging the stages shown. The process 410 differs from the processes 210 and 310 in two major ways. Instead of monitoring float voltage during a first time period, as in stage 212 in processes 210 and 310, a discharge of the battery is monitored for the first time period. In addition, instead of the operating condition of the battery being temperature, as in process 210, or being a previous discharge event preceding the first time period, as in process 310, the operating condition of the battery is a discharge event during the first time period.

The process 410 starts at stage 412 where the battery monitor 42 monitors the discharge of the battery during the first time period. The cycle life value module 40 receives data from the battery monitor 42 that is indicative of the discharge event. Preferably, the cycle life value module 40 receives periodic, e.g., every 1 minute, 5 minutes, 10 minutes, etc., data indicative of the current at which the battery is being discharged.

When the data received from the battery monitor 42 indicate that the discharge event has concluded, the process 410 continues to stage 414 where the cycle life value module 40 determines the rate at which the battery was discharged and the depth of discharge of the battery during the first time period. The rate can be an average of the periodic discharge rates monitored at stage 412. The depth of discharge is determined by integrating the discharge rate over the first time period and comparing this to the rated capacity of the battery.

Figure 12:
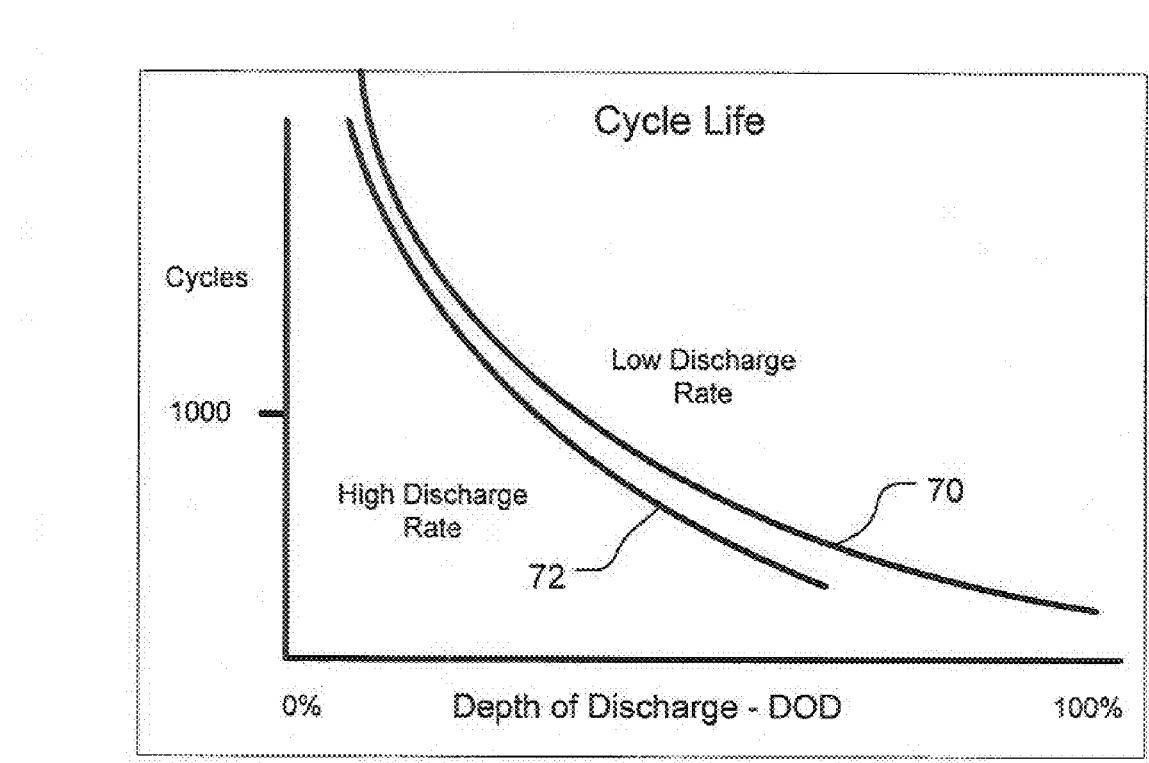
FIG. 12 is a graph showing expected numbers of discharge cycles versus various discharge rates and depths of discharge.

At stage 415, the cycle life value module 40 determines an estimated number of discharge cycles that the battery can be expected to endure in a lifetime. This estimate is made based on data accumulated during testing. The number of cycles that a battery can endure is a function of the discharge rate and/or the depth of discharge. Referring to FIG. 12, two curves 70 and 72 show the expected number of discharge cycles versus depth of discharge. Curve 70 represents the expected number of discharge cycles for a low discharge rate and curve 72 represents the expected number of discharge cycles for high discharge rate. These curves 70 and 72 are samples and discharge testing could be performed to obtain similar curves for actual batteries. The testing could be accomplished in the field with the field equipment having the battery life estimation system 60 communicating the discharge rates and depths of discharge to a data center and also communicating when the battery reached end of life. Testing could show that the expected number of discharge cycles is a function of depth of discharge but not rate of discharge, or is a function of rate of discharge but not depth of discharge. If either of these is true, then the cycle life module 40 could determine the rate of discharge and/or the depth of discharge at stage 414, but need not determine both.

The cycle life module 40 interpolates data representing the curves 70 and 72 to determine the expected number of discharge cycles (N) of this type, as characterized by the rate and/or depth of discharge, that the battery can be expected to endure. Continuing to block 415, the cycle life module determines a first battery life value by determining a cycle life contribution based on the number of discharge cycles (N) determined at stage 415. For example, if it was determined at stage 415 that 1000 discharge/recharge cycles of this type could be expected to be endured, then the cycle life module 40 would determine that the cycle life decrement ($\Delta CL$) would be 1/1000 or 0.1%.

At block 418, the cycle life module 40 combines the cycle life decrement $\Delta CL$ determined at stage 416 with a second cycle life value for a second time period, e.g., the previously determined and accumulated cycle life decrements for discharge time periods prior to the first time period. The accumulated battery decrements are then used by the remaining life module 38 to estimate the remaining battery lifetime at stage 420. The functions performed at stages 422 and 424 are the same as those functions discussed above in reference to the stages 122 and 124, 222 and 224, and 322 and 324 in the processes 110, 210 and 310, respectively.

Figure 8:
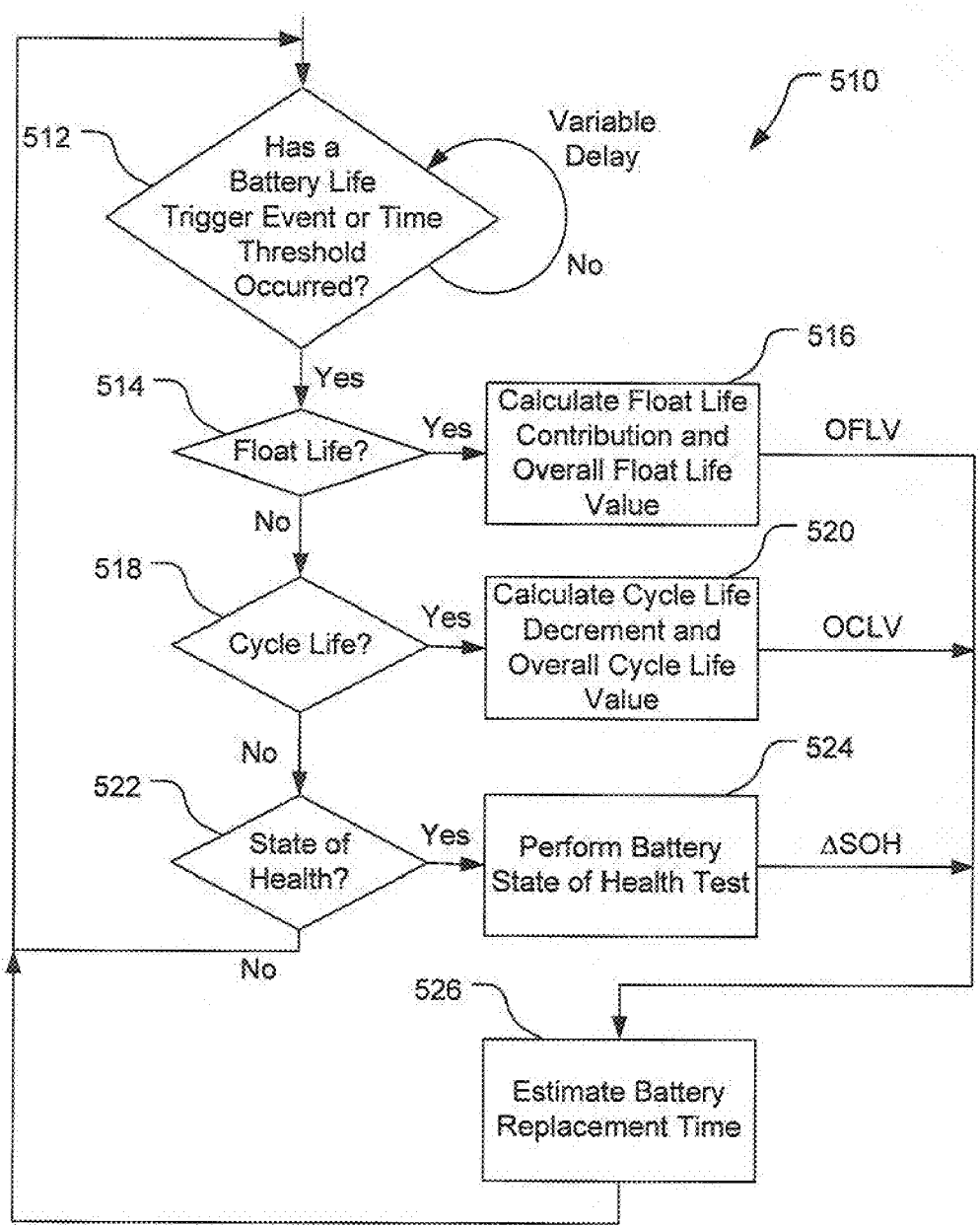
FIG. 8 is a flowchart of an embodiment of a process that combines elements of the processes of FIGS. 5-7 for determining the remaining lifetime of the battery.

Preferably, the remaining life module 38 is configured to combine all of the battery life values determined by both the float life module 39 and the cycle life module 40. This combination includes float life values, e.g. float life decrements, scaled for temperature using the process 210 and scaled for previous discharge cycles using the process 310 and cycle life values, e.g., cycle life decrements determined using the process 410. Referring to FIG. 8, a process 510 for combining float life and cycle life contributions includes the stages shown. The process 510 is exemplary only and not limiting. The process 510 may be modified, e.g., by adding, removing, or rearranging the stages shown. At stage 512, the float life module 39, the cycle life module 40 and/or the state of health module 41 determines whether or not a battery life trigger event or a time threshold event has occurred. The trigger event can be the start and conclusion of a discharge event, the end of a float charge time period, etc. The process 510 continues to loop back to stage 512 in a variable delay loop until an event occurs for which a float life value, a cycle life value or a state of health status check is to be performed.

If it is determined at stage 512 that a battery life affecting event has occurred, then the process 510 continues to stage 514, where the float life value module 39 determines if a float life contribution determination is to be performed. If a float life contribution is determined to be performed, then the process 510 continues to stage 516, where the float life value module performs the functions at the stages 212, 214, 216 and 118 of the process 210, and/or the functions at the stages 314, 315, 312, 316 and 118 of the process 310 as discussed above. The overall float life value (OFLV) determined at block 118 is then forwarded to the remaining life module 38 and the process 510 continues to stage 526, where the remaining life module 38 estimates the battery lifetime remaining. Details of the functions performed at stage 526 are discussed below in reference to FIG. 9.

If it is determined at stage 514 that a float life contribution is not to be determined, then the process 510 continues at stage 518, where the cycle life value module determines if a cycle life contribution is to be performed. If a cycle life contribution is determined to be performed, then the process 510 continues to block 520, where the cycle life value module performs the functions at the stages 412, 414, 415, 416 and 118 of the process 410 as discussed above. The overall cycle life value determined at stage 118 is forwarded to the remaining life module 38 and the process 510 continues to stage 526, where the remaining life module 38 estimates the battery lifetime remaining.

If it is determined at stage 518 that a cycle life contribution is not to be determined, then the process 510 continues to stage 522, where the state of health module 41 determines if a state of health test is scheduled. State of health tests can be schedule periodically. As a battery gets older, more frequent tests may be desirable. If it is determined at stage 522 that a state of health test is scheduled to occur, then the process 510 continues to stage 524, where the state of health module determines the state of health delta ($\Delta SOH$) of the battery. Preferably, the $\Delta SOH$ value is an estimated percentage adjustment to apply to the estimation of battery life remaining. The $\Delta SOH$ value is used by the remaining life module 38 at stage 526 as an adjustment to the battery life estimation based on the float life and cycle life contributions. The $\Delta SOH$ value adjusts the remaining life estimation to more closely match the state of health estimation when the state of health determined by test, are at low levels where the SOH test results are typically more accurate. Details of a method of combining the SOH value with the float life and cycle life contributions are discussed below in reference to FIG. 13.

Figure 9:
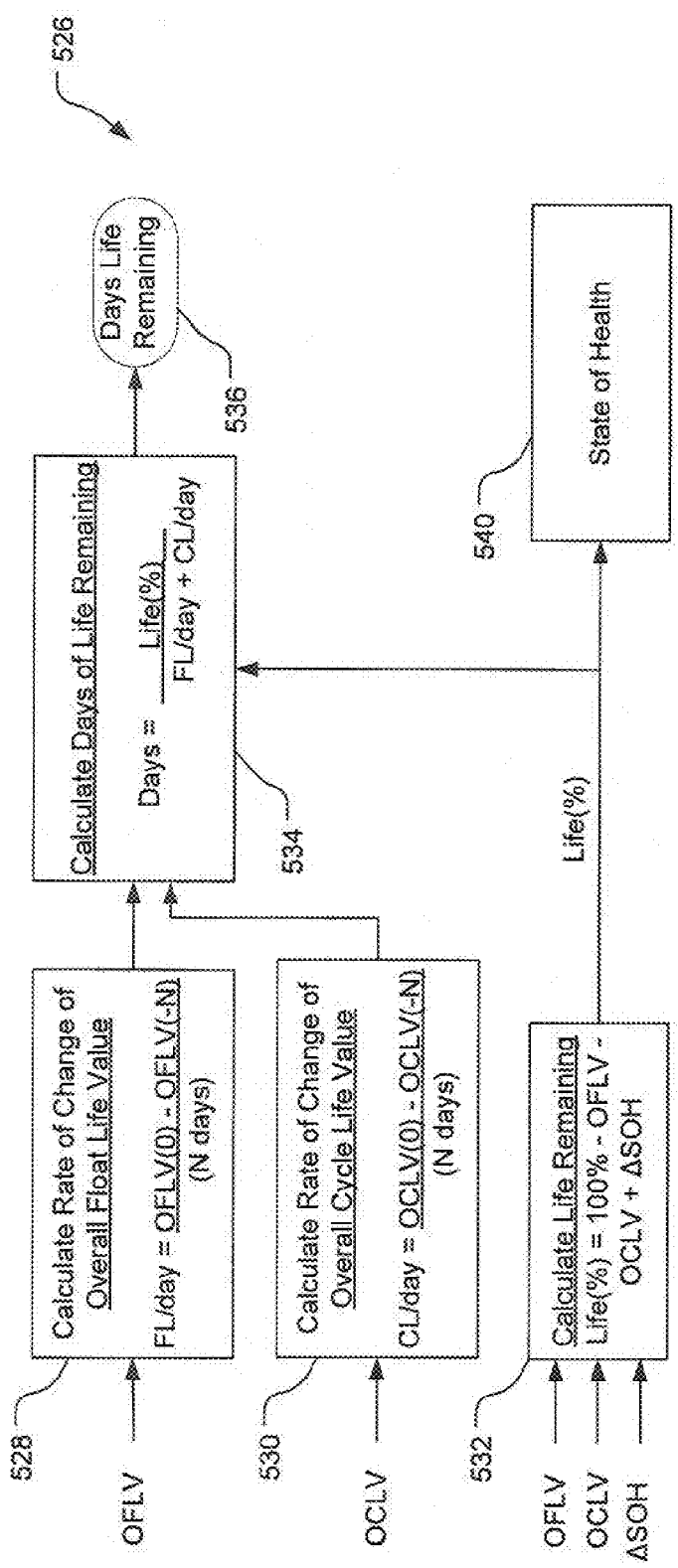
FIG. 9 is a flowchart of details of a portion of the process of FIG. 8.

Referring to FIG. 9, details of functions performed by the remaining life module 38 at stage 526 of the process 510 include the stages shown. The stages shown in FIG. 9 are exemplary only and not limiting. The stages in FIG. 9 may be modified, e.g., by adding, removing, or rearranging the stages shown. At stage 528, the overall float life value (OFLV) that was determined at stage 516 in the process 510 is received from the float life value module 39. The OFLV (in percent) includes all the accumulated float life contributions, decrements in this example, up to the current day. The remaining life module 38 calculates a rate of change of the OFLV for the last N days, where N is chosen to be representative of the recent charge, discharge and environmental factors applied to the battery, and where the battery usage over the prior N days is expected to continue into the future. OFLV(−N) represents the OFLV N days ago and OFLV(0) represents the current OFLV. Thus, the FL/day calculated at stage 528 is the average loss of float life, in percent per day, during the prior N days.

At stage 530, the overall cycle life value (OCLV) that was determined at stage 520 in the process 510 is received from the cycle life value module 40. The OCLV (in percent) includes all the accumulated cycle life contributions, decrements in this example, up to the current day. The remaining life module 38 calculates a rate of change of the OCLV for the last N days, where N is chosen to be representative of the recent charge, discharge and environmental factors applied to the battery, and where the battery usage over the prior N days is expected to continue into the future. OCLV(−N) represents the OCLV N days ago and OCLV(0) represents the current OCLV. Thus, the CL/day calculated at stage 530 is a loss of cycle life, in percent per day, during the prior N days.

At stage 532, the remaining life module 38 calculates the remaining life percentage by subtracting the OFLV and OCLV from 100%. The ΔSOH value is a value determined by the state of health module 41 at stage 540 and will be discussed in detail below in reference to FIG. 13. State of health is a measure of the ampere-hours (or watt-hours) that a battery is capable of delivering compared to its nominal rated value. A new battery has a state of health of approximately 100%. For about the first 60% to 70% of battery life, the state of health remains at high values between about 90% and about 100% and there is little correlation between state of health and the percent of battery life remaining. For this reason the ΔSOH value is set equal to zero when a battery is new and no adjustment to battery life is made. It is not until the battery state of health is less than about 90% that there is a strong correlation between state of health and remaining life.

When ΔSOH is equal to zero, the Life(%) calculated at stage 532 reflects subtraction of both the OFLV and OCLV values. For example, if the OFLV=20% and the OCLV=10%, then the Life(%) would estimate 70% remaining battery lifetime. When the SOH tests show significant battery life loss, the ΔSOH will be set to a value to force the remaining life calculation at stage 532 to more closely match the SOH test indications. The ΔSOH value is updated every time that a SOH test is performed at block 524 in the process 510 of FIG. 8. The state of health test may be initiated manually, or automatically according to a predefined schedule. It may also be accomplished simultaneously with a random power outage condition of power source 52 that causes the UPS to operate from battery power for an extended time.

At stage 534, the remaining life module 38 calculates the days of remaining battery life based on the combined float and cycle life value loss per day. The FL/day and CL/day values are combined linearly in this example. Alternatively, they could be combined on a weighted basis where one is given a higher weight or confidence value than the other. The float life value could be given a higher weight for areas where the float life contributions dominate the battery life calculations. The cycle life value could be given a higher weight in areas where there are many power blackouts, brownouts, surges and the cycle life contribution dominates.

At stage 536, the remaining battery life may be communicated to the user. If the remaining battery life is below one or more thresholds, warnings or alarms can be communicated that the battery should be replaced soon or immediately. The Life(%) value calculated at stage 532 is communicated to the state of health module 41 at stage 540.

Figure 13A:
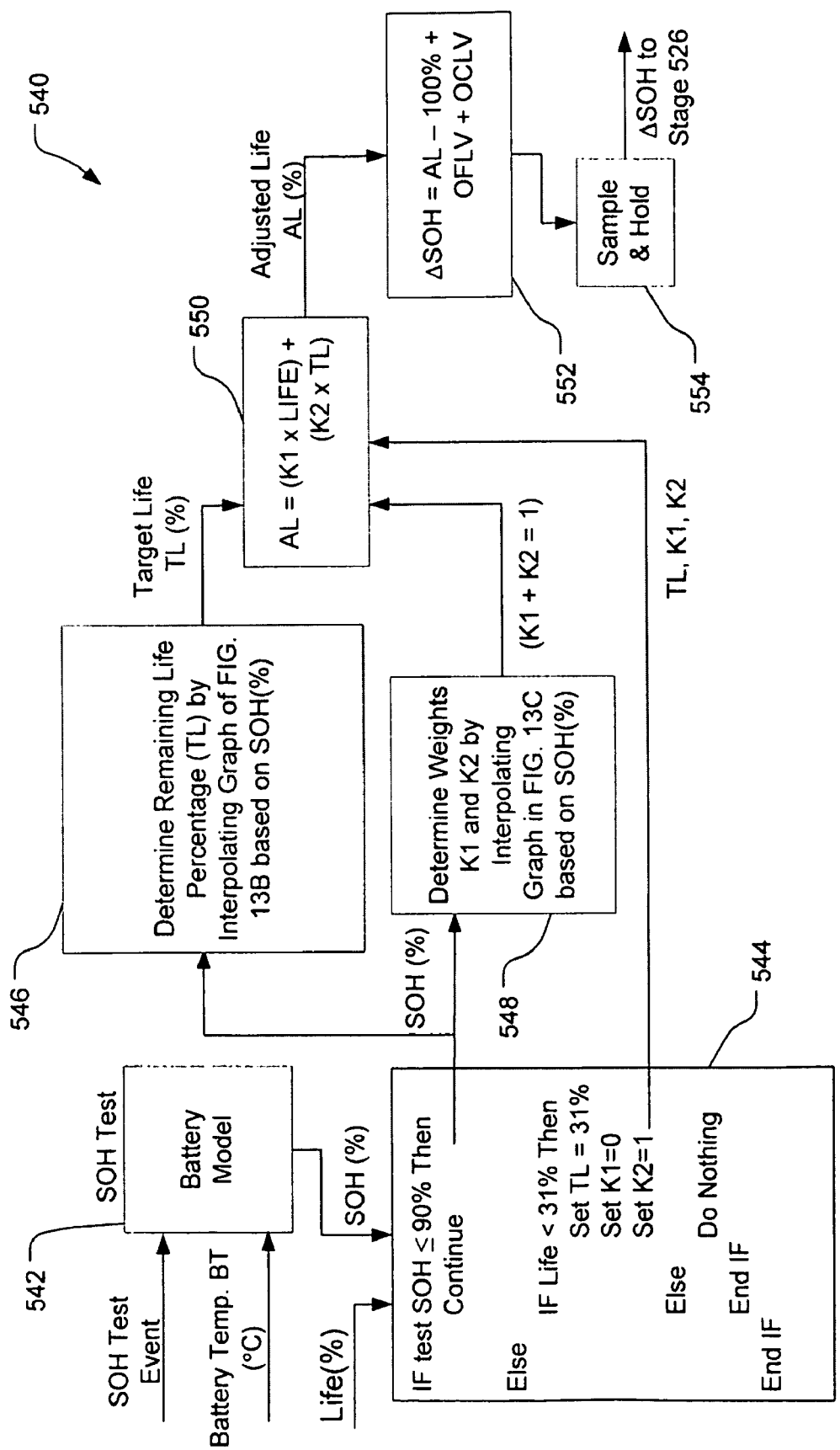
FIG. 13A is a flowchart of details of another portion of the process of FIG. 8.

Referring to FIG. 13A, details of the functions performed by the state of health module 41 at the stage 540 include the stages shown. The stages shown in FIG. 13A are exemplary only and not limiting. The stages in FIG. 13A may be modified, e.g., by adding, removing, or rearranging the stages shown. At stage 542, the state of health module 41 performs a SOH test. A SOH Test Event signal initiates the test. The state of health module 41 receives an indication of battery temperature as the SOH test takes into account battery operating temperature. The SOH test typically involves running the battery down to a low voltage level at a steady current. The capacity of the battery is then determined and output as an SOH(%) measurement. The SOH(%) measurement is a ratio of the capacity determined during the SOH test compared to an expected capacity for a healthy battery.

Upon completing the SOH test, the process 540 continues to stage 544, where threshold values for the SOH(%) and Life(%) variables are applied. The Life(%) is the most recent remaining battery life estimation determined by the remaining life module 38 at the stage 526 shown in FIGS. 8 and 9. Two thresholds are applied at stage 544. The first involves an SOH(%) threshold where the SOH tests are utilized. If the SOH(%) is less than or equal to 90%, then the process continues to stages 546 and 548 where the SOH(%) is used to estimate remaining battery life and to identify weighting factors K1 and K2, respectively. This 90% threshold is the maximum threshold value below which the SOH tests are typically judged to be accurate and useful for estimating low values of battery life. Above 90%, the SOH(%) is preferably used only for indicating a minimum estimated battery life.

The second threshold applied at stage 544 applies if the SOH(%) is greater than 90%. In this case, if the Life(%) estimation is less than about 31%, then the Life(%) is below the minimum expected life. This is apparent from the remaining battery life graph used at stage 546 and discussed below. In this case, the Life(%) is ignored by setting the target life (TL) variable to 31% and setting the weight K1=0 and setting the weight K2=1 at stage 544. Target life, TL, is a percentage life remaining target that is based on the SOH test. This is combined, at stage 550, with the Life(%) estimation using the weights K1 and K2 to determine an adjusted life percentage, AL(%). By setting TL=31, K1=0 and K2=1, the function performed at stage 550 will force the AL(%) to 31%. For SOH tests, where the SOH(%) is below 90% K1 and K2 values are set which cause weighted values of Life(%) and TL to determine AL.

If, at stage 544, the SOH(%) was greater than 90% and the Life(%) estimation was less than 31%, then the process 540 continues to stage 550, where the adjusted life variable AL is forced to 31%. If, at stage 544, the SOH(%) was less than 90% and Life(%) is greater than 31%, then no further action is taken and the ΔSOH value remains unchanged, thus leaving the Life(%) determined at 532 (FIG. 9) unchanged. If, at stage 544, the SOH(%) was less than 90%, then the process 540 continues to stages 546 and 548, which are shown in parallel in this example, but can be performed in series. At stage 546, the SOH(%) level is used to estimate the target life, TL. The TL is the remaining lifetime resulting only from the SOH(%) value determined at stage 542. The TL is later combined with the Life(%) at stage 550 using the weights K1 and K2.

Figure 13B:
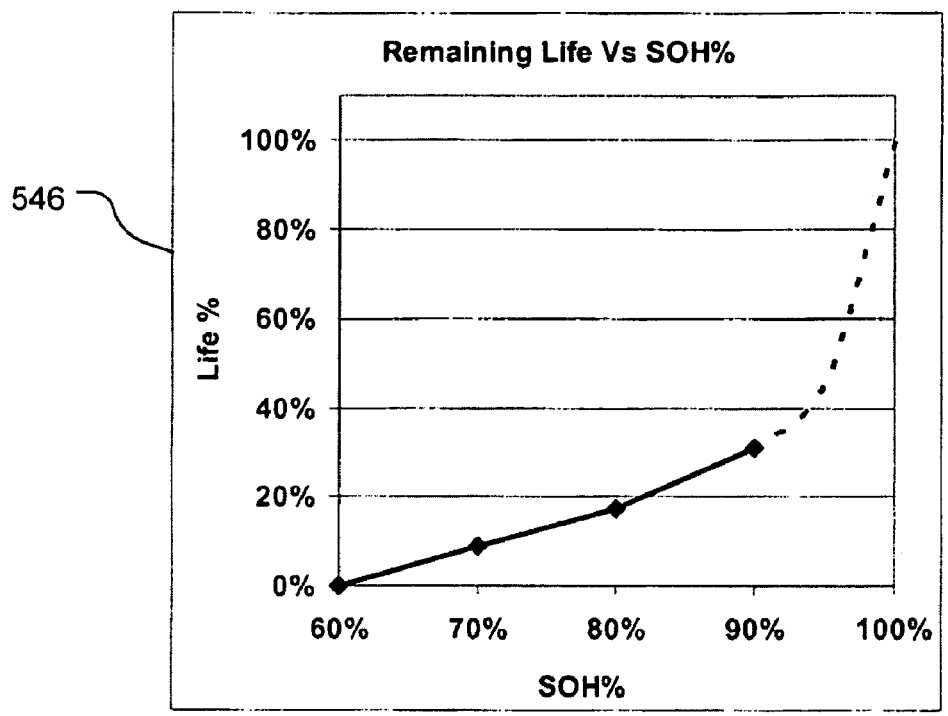
FIGS. 13B and 13C are graphs used at stages 546 and 548, respectively, of the process of FIG. 13A.

The graph shown in FIG. 13B is used to determine the remaining life percentage at stage 546. The graph illustrates two portions of remaining life percentage, here TL, versus SOH(%). The graph includes a dashed portion for values of SOH(%) greater than 90%. This indicates the portion of the graph where SOH(%) is not an accurate indicator of remaining battery life. Since the threshold test at stage 544 would divert the process from proceeding to stage 546 for values of SOH(%) greater than 90%, this portion the graph is shown for clarity purposes. The second portion of the graph at stage 546 is for SOH(%) values below 90%. This portion of the graph shows that the estimated remaining battery life varies from about 31% at an SOH(%) of about 90%, to a remaining life value of 0% at a SOH(%) of about 60%. The state of health module 41 interpolates data representing the graph of FIG. 13B to determine the TL value that will be combined with the Life(%) estimation at stage 550. Other batteries may exhibit different remaining life estimations versus SOH(%) than the graph shown in FIG. 13B. In the example shown, the battery will be replaced at an SOH(%) of 60%, but the curve could be adjusted such that batteries are replaced at another value of SOH(%) such as 50%, 65%, 70%, 75%, or 80%, for example.

Figure 13C:
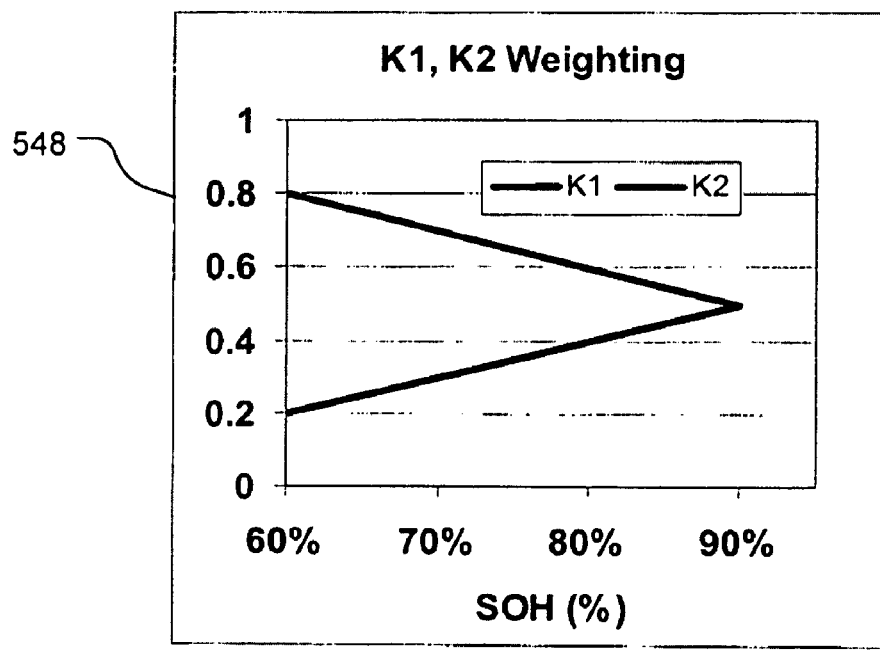

At stage 548, the state of health module 41 determines the weights K1 and K2 used to combine the SOH(%) estimation and Life(%) estimations. The graph shown in FIG. 13C is used to determine the weights K1 and K2 at stage 548. The graph shows two curves of weights versus SOH(%) for values of SOH(%) less than or equal to about 90%. The curve for K1 varies linearly from a value of 0.2 at a SOH(%) of about 60% to a value about 0.5 at a SOH(%) of about 90%. The curve for K2 varies linearly from a value of about 0.8 at a SOH(%) of about 60% to a value of 0.5 at a SOH(%) of about 90%. The total of K1+K2 is 1.0. The state of health module 41 interpolates data representing the curves for K1 and K2 based on the SOH(%) value determined at stage 542 for all SOH(%) less than or equal to 90%. The weightings K1 and K2 are configured such that as the SOH(%) gets closer and closer to 60%, where the remaining battery life is zero in this example, the value of K2 gets larger such that the AL value determined based on the weights at stage 550, is more heavily weighted towards the TL estimation based on the SOH(%) at stage 546. When the SOH is larger, but still judged to be accurate, the weights are closer such that the Life(%) estimation is given more weight. The curves for K1 and K2 are linear in this example, but could be non-linear.

Upon determining the TL value at stage 546 and the weights K1 and K2 at stage 548, the process 540 continues to stage 550, where the AL value is determined based on the TL estimation, the Life(%) estimation, and the weights K1 and K2. The AL value is the percentage of remaining battery life taking into account the latest SOH test and the latest remaining life estimation performed at block 526 as shown in FIGS. 8 and 9.

Upon determining the AL value at stage 550, the process 540 continues to stage 552, where the $\Delta$SOH modification to the remaining life estimation is determined. The $\Delta$SOH represents the modification needed to force the latest remaining life estimation performed at stage 526 to be equal to the AL valued determined at stage 550. The $\Delta$SOH is set equal to the AL percentage minus 100% plus the latest accumulated OFLV and OCLV percentage values for float life and cycle life that were used to estimate the latest Life(%) estimation. The $\Delta$SOH determined at stage 552 is forwarded to a sample and hold at stage 554. The $\Delta$SOH value at the sample and hold stage 554 remains fixed until the process 540 is repeated. The sample and hold stage 554 forwards the $\Delta$SOH value to the remaining life module 38 such that the latest $\Delta$SOH value can be used the next time a remaining life estimation is made. The function at stage 552 is derived for cases where the OFLV and OCLV values are life decrements. Other forms of life values of OFLV and OCLV could be used with the function at stage 552 being modified accordingly.

The methodology discussed in reference to the process 410 of FIG. 7, can be used to calculate the cycle life contribution for a discharge cycle when the battery is fully recharged before the next discharge cycle begins. If the methodology discussed above in reference to the process 410 were applied to a situation including two discharge cycles where the second discharge cycle starts before the battery is fully recharged after the first discharge cycle, then errors would be introduced into the overall battery life value calculations.

Figure 14:
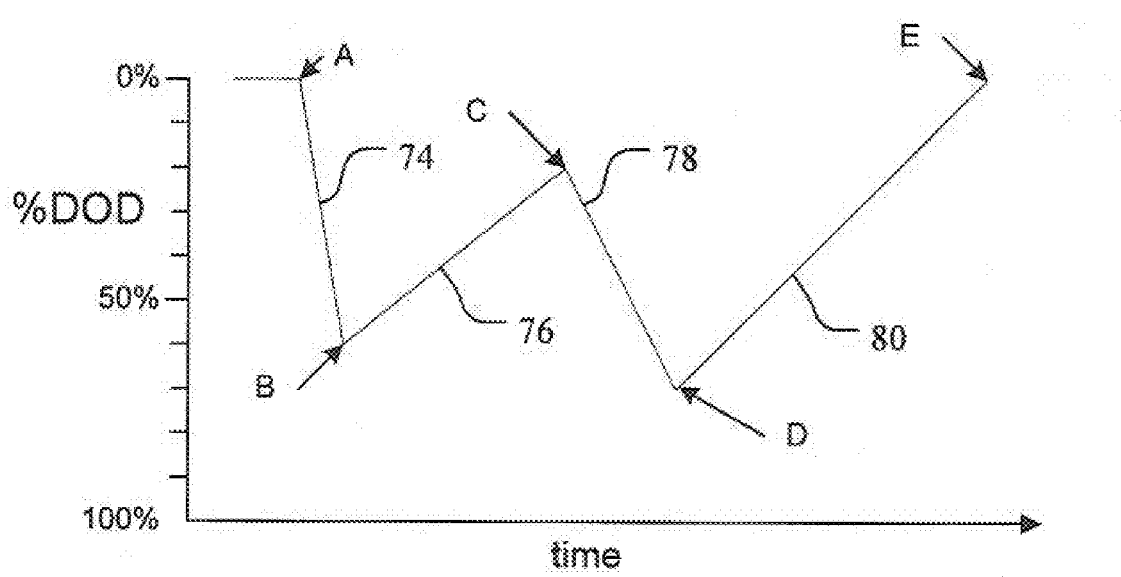
FIG. 14 is a graph of two sequential discharge/charge cycles.

An example of this situation is depicted in FIG. 14. A first discharge cycle 74 begins at point A where the battery is fully charged. The first discharge cycle 74 ends at point B with a depth of discharge (DOD) of 60%. A first charge cycle 76 begins at point B and concludes at point C where a second discharge cycle 78 begins. At the conclusion of the first charge cycle 76, the battery is partially charged and the DOD decreases from 60% to 20%. The second discharge cycle 78 concludes at point D at a DOD of 70%. A second charge cycle 80 fully charges the battery to a DOD of 0%.

If the methodology of process 410 were applied to both discharge cycles 74 and 78, the cycle life contribution of the first discharge cycle 74 would be based on a DOD of 60% and the cycle life contribution of the second discharge cycle 78 would be based on a DOD of 70%. However, this would correspond to a total discharge of 130%, whereas, the total discharge was actually 60% for discharge cycle 74 and 50% for discharge cycle 78 (point C is at a DOD of 20% and point D is at a DOD of 70% resulting in a change of 50% discharge) for a total of 110% total discharge. Thus, using the simple methodology of the process 410 would result in an overestimate of the cycle life contribution for the second discharge cycle 78 of about 20%.

An alternative method provides for a way of determining a cycle life contribution for eases where a discharge cycle starts before a charge cycle has charged the battery to a fully charged condition. The simple methodology of the process 410 utilizes an estimate of the number of discharge/charge cycles that a battery could expect to experience in a lifetime for a given DOD, where the battery is fully recharged after each discharge. The methodology discussed here uses a normalized cycle measure. Table 1 lists data similar to the curves 70 and 72 of FIG. 12. The first column of Table 1 lists the DOD (in percent) and the second column lists the expected number of cycles that a battery is expected to have in a lifetime for the given DOD of the first column. The third column lists the normalized cycles that a battery can be expected to have in a lifetime, where the normalized cycle value is obtained by multiplying the DOD of the first column by the cycles number of the second column.

TABLE 1

| DOD (%) | Cycles | Normalized Cycles (Cycles * DOD) |
|---|---|---|
| 100 | 201 | 201 |
| 70 | 362 | 253 |
| 50 | 555 | 277 |
| 40 | 765 | 305 |

TABLE 1-continued

| DOD (%) | Cycles | Normalized Cycles (Cycles * DOD) |
|---|---|---|
| 30 | 1113 | 334 |
| 20 | 1708 | 342 |
| 10 | 3615 | 362 |
| 5 | 7651 | 383 |
| 2.5 | 17083 | 427 |

The normalized cycles number of the third column can be thought of as the number of complete (100%) discharge/charge cycles that the battery can expect in a lifetime. For example, the battery can expect 201 complete cycles when the DOD is 100%. When the DOD is 70%, the battery can expect 362 discharge/charge cycles at 70%, but this is equivalent to only 253 complete discharge/charge cycles. Using the normalized cycles number in the cycle life contribution calculations, along with the DOD scaling allows for improved determination of a cycle life contribution for a discharge cycle that starts before a battery has been completely recharged following a previous discharge event.

Figure 15:
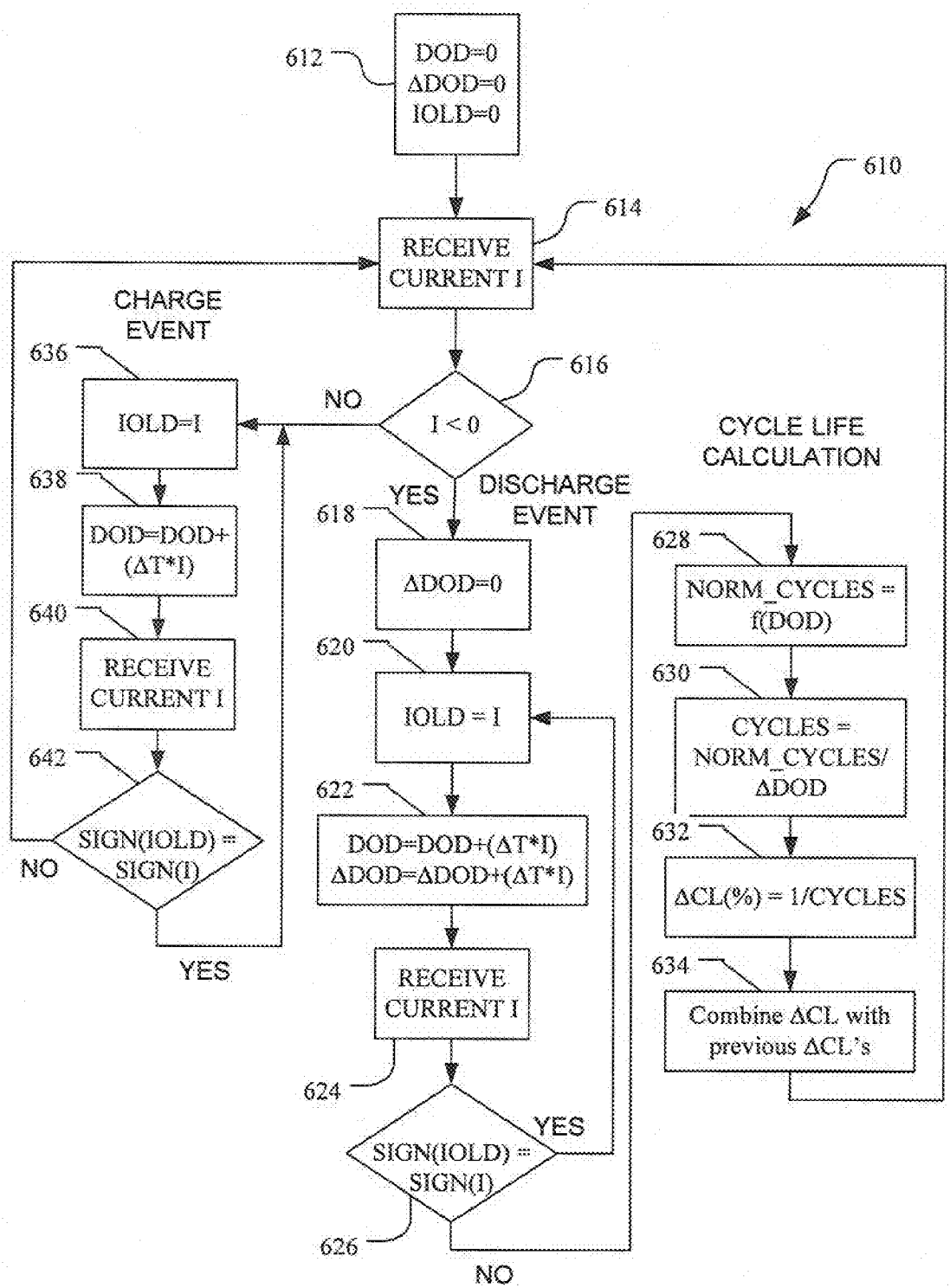
FIG. 15 is a flowchart of an embodiment of a process for determining cycle life contributions for sequential discharge/charge cycles as shown in FIG. 14.

Referring to FIG. 15, a process 610 for determining cycle life contributions for sequential discharge/charge cycles, such as those of FIG. 14 includes the stages shown. The process 610 is exemplary only and not limiting. The process 610 may be modified, e.g., by adding, removing, or rearranging the stages shown. The process 610 can be executed by the cycle life value module 40 for performing the processing at the stages 414, 415 and 416 in the process 410.

The process 610 starts at stage 612, where initial values are set for the variables used in the process 610. The depth of discharge variable DOD is set to zero, the ΔDOD variable is set to zero, and the IOLD variable is set to zero. The DOD variable is used to keep track of the instant (present time) or net depth of discharge of the battery. The ΔDOD variable is used to keep track of the depth of discharge of a current discharge event. The IOLD variable is used to detect when the current, represented by the variable "I", changes from a positive (charging) to a negative (discharging) or vice-versa.

At stage 614, the current I is received from the battery monitor 42 or the processor 30. The current I is a normalized value equal to the actual current in amperes divided by the dimensionless rated ampere-hours, C. At stage 616, if the current is less than zero, the process 610 continues to stage 618 to estimate the depth of discharge during a discharge event. If, at stage 606, the current is greater than or equal to zero, the process 610 continues to stage 636 to estimate the depth of discharge during a charge event.

The process 610 will be described further in reference to the discharge and charge cycles shown in FIG. 14. Starting at point A in the discharge cycle 74, the current I at stage 616 is negative and the process 610 continues to stage 618. At stage 618, the variable ΔDOD is set equal to zero and at stage 620 the IOLD variable is set equal to the value of the current I that was received at stage 614.

At stage 622, the current I is integrated over a time period ΔT and added to the instant DOD value and the instant ΔDOD value to estimate the depth of discharge based on the current I. A simple first order digital summation is shown in this example, but other methods of integration can be used.

At stage 624, a new measure of the current I of the battery is received. At stage 626, it is determined if the SIGN of the new current I is the same as the SIGN of the previous current value (IOLD). The SIGN function returns a negative one if the current I is less than zero and returns a positive one if the current I is greater than or equal to zero. In this way, the process 610 determines when the first discharge cycle 74 ends and the first charge cycle 76 begins. If the determination at stage 626 is affirmative, the process 610 returns to stage 620 and the stages 620 to 626 continue until the first discharge cycle 74 ends at point B.

After processing stages 620-626 from point A to point B in the first discharge cycle 74, the current I changes from a negative value to a positive value and the process 610 continues from stage 626 to stage 628 to calculate a cycle life contribution for the first discharge cycle 74. At this point, the DOD equals 60% and the ΔDOD also equals 60%. At stage 628, the number of normalized cycles that the battery can expect to sustain in a lifetime is determined based on the DOD of 60% that the first discharge cycle 74 exhibited. This can be accomplished by interpolating the data in Table 1. At a DOD of 60%, the NORM_CYCLES variable equals 265 cycles.

At stage 630, the normalized cycles are de-normalized by dividing by the ΔDOD of 60%. In this case, where the ΔDOD equals the DOD, the normalized cycles are simply converted back to the cycles value of the second column of Table 1, or 458.5 cycles. The normalized cycles and the ΔDOD affect the cycle life calculation as discussed below.

At stage 632, the cycle life contribution ΔCL (in percent) is set equal to the reciprocal of the CYCLES (485.5) or about 0.22%. At stage 634, the ΔCL of about 0.22% is combined with previously determined cycle life contributions to determine the overall cycle life value. As discussed above, the overall cycle life value is used for calculating the remaining battery life as discussed above. Returning to stage 614, a new current I, which is now a positive value in the first charge cycle 76 is received. Continuing to stage 616, the positive current I results in the process 610 proceeding to stage 636 to estimate the depth of discharge during the first charge event 76.

Stages 636, 638, 640 and 642 function similarly to the stages 618, 620, 622 and 624, respectively, except that no ΔDOD value is needed at stage 638 during a charge event. The DOD value decreases due to the current I during the entire first charge cycle 76 until the current I turns negative at point C and the second discharge cycle 78 ensues. At this time, the process 610 proceeds from stage 642 to stage 614 then stage 616 with the variable DOD equal to 20% (see point C in FIG. 14).

At stage 616, the negative current I causes the process 610 to proceed to the discharge event stages 618 to 626. The stages 618-626 are processed until the time reaches point D where the current I turns from negative to positive. At this point, the value of DOD is 70% and the value of ΔDOD is 50% because the DOD changes from 20% to 70% during the second discharge cycle 78.

Continuing to stage 628, the normalization cycles are calculated to be equal to 253 using the data in Table 1 for a DOD of 70%. At stage 630, the normalization cycles are de-normalized by dividing by the ΔDOD of 50%, resulting in the CYCLES equaling 506. The ΔDOD of 50% was used to de-normalize the NORM_CYCLES variable which is used to determine a cycle life value. Had the DOD of 70% been used to de-normalize the NORM_CYCLES, the CYCLES would have been equal to about 362, which would result in a much large cycle life contribution.

At stage 632, the cycle life contribution ΔCL is calculated to be about 0.20%. At stage 634, the ΔCL of 0.20% is combined with the overall cycle life values of previous discharge periods. The process 610 continues back to stage 614, and will process the second charge cycle 80 from point D to point E.

The accuracy that is gained by using the normalized cycles in computing the cycle life calculation is substantial. If the DOD value of 70% (from point D in FIG. 14) is used to de-normalize the normalized cycles, which is equivalent to not using the normalized cycles methodology, the ΔCL calculated for the second discharge cycle would be about 0.28% (1/362) compared to 0.20% for a ΔDOD of 50%. When combined with the ΔCL of 0.22% determined for the first discharge cycle 74, the total cycle life value calculated using regular cycles results in about 0.5% and the total cycle life value calculated using normalized cycles results in about 0.42%. Thus, there is about a 20% overestimate of the cycle life contribution using the regular cycles compared to using the normalized cycles. This compares well with the example discussed above where the methodology of process 410 would compute cycle life for a total discharge of 130% for discharge cycles 1 and 2, whereas the total discharge for discharge cycles 1 and 2 is 110% (130 divided by 110 is about 1.20, or a 20% overestimate).

The data shows in Table 1 is exemplary only. Some types of batteries may exhibit different expected numbers of cycles for different discharge rates. Different data tables, similar to Table 1, could be obtained for different discharge rates for these types of batteries.

Some of the details of the battery life estimation methods discussed above are based on batteries comprising a lead-acid chemistry. However, methods of the disclosure can be applied to other battery chemistries. For example, the environmental and charge/discharge characteristics that affect other types of batteries may be very different than those discussed above, and the mathematical and/or empirical relationships used to estimate battery life can be different. Furthermore all lead-acid chemistries are not identical, so adjustments may be made to the mathematical and/or empirical relationships to compensate for some battery chemistries and possibly even battery construction methods.

Other embodiments are within the scope of the disclosure.

What is claimed is:

1. A method of estimating battery lifetime, the method comprising:
    monitoring a charge characteristic of a battery during a first time period corresponding to a type of battery event;
    monitoring an operating condition of the battery wherein the operating condition depends on the type of battery event of the first time period;
    calculating a first battery life decrement caused by the type of battery event of the first time period based on the monitored operating condition of the battery, the monitored charge characteristic, and a duration of the first time period;
    determining an overall battery life value by combining the first battery life decrement and a second battery life decrement for a second time period wherein the second time period is prior to the first time period and corresponds to at least one prior occurrence of the same type of battery event of the first time period; and
    estimating a remaining battery lifetime for the battery based on the overall battery life value.

2. The method of claim 1 wherein the first time period is a float time period, the operating condition comprises an operating temperature of the battery, the charge characteristic comprises a float voltage applied to the battery, and determining the first battery life decrement is based on the duration of the first time period, the operating temperature of the battery during the first time period, and the float voltage.

3. The method of claim 2 wherein determining the first battery life decrement further comprises determining a float life contribution and scaling the float life contribution to account for a rate of chemical reaction of the battery at the operating temperature.

4. The method of claim 2 further comprising adjusting a level of the applied float voltage to compensate for the operating temperature of the battery, and wherein determining the first battery life decrement comprises determining a float life contribution and scaling the float life contribution to account for an adjusted float voltage level applied during the first time period.

5. The method of claim 1 wherein the first time period is a float time period, the operating condition of the battery comprises a discharge of the battery during a discharge in a third time period prior to the first time period, and the charge characteristic comprises a float voltage applied to the battery, the method further comprising: monitoring discharge of the battery during the third time period; and determining a discharge rate at which the battery was discharged during the third time period, wherein determining the first battery life decrement comprises: determining a float life decrement based on the float voltage and the duration of the first time period; and scaling the float life decrement to account for the battery being discharged at the discharge rate during the third time period.

6. The method of claim 5 further comprising reducing an effect that the scaling has on the float life decrement based on an amount of time that the third time period preceded the first time period.

7. The method of claim 5 wherein the discharge event in the third time period is a most recent one of a plurality of discharge events that occurred prior to the first time period.

8. The method of claim 5 wherein scaling the float life decrement comprises applying a scale factor to the float life decrement, wherein a first scale factor for a first discharge rate results in a smaller scaled float life decrement for the first time period than does a second scale factor for a second discharge rate with the first discharge rate being lower than the second discharge rate.

9. The method of claim 1 wherein the first time period is a discharge period, the method further comprising: monitoring discharge of the battery during the discharge period; determining, for the discharge period, a rate and/or depth of discharge of the battery; and determining an estimated number of discharge cycles based on the discharge rate and/or the depth of discharge, wherein determining the first battery life decrement comprises determining a cycle life contribution for the first time period based on the estimated number of discharge cycles.

10. The method of claim 1 further comprising: determining a capacity of the battery by performing a state of health test; and adjusting the remaining battery lifetime based on the determined capacity.

11. An apparatus for estimating battery lifetime, the apparatus comprising:
    a battery monitor configured to monitor a charge characteristic of a battery during a first time period corresponding to a type of battery event;
    a life value module coupled to the battery monitor and configured to
    monitor an operating condition of the battery wherein the operating condition depends on the type of battery event of the first time period,
    calculate a first battery life decrement caused by the type of battery event of the first time period based on the monitored operating condition of the battery, the monitored charge characteristic, and a duration of the first time period, and determine an overall battery life value by combining the first battery life decrement and a second battery life decrement for a second time period wherein the second time period is prior to the first time period and corresponds to at least one prior occurrence of the same type of battery event of the first time period; and a remaining life module coupled to the life value module and configured to estimate a remaining battery lifetime for the battery based on the overall battery life value.

12. The apparatus of claim 11 wherein the first time period is a float time period and the life value module is a float life value module, the battery monitor is configured to monitor a float voltage applied to the battery during the first period, and the float life value module is configured to monitor an operating temperature of the battery and determine the first battery life decrement based on the duration of the first time period, the operating temperature of the battery during the first time period, and the float voltage.

13. The apparatus of claim 12 wherein the float life value module is configured to determine the first battery life decrement by determining a float life contribution and scaling the float life contribution to account for a rate of chemical reaction of the battery at the operating temperature.

14. The apparatus of claim 12 wherein a level of the applied float voltage is adjusted to compensate for the operating temperature of the battery, and the float life value module is configured to determine the first battery life decrement by determining a float life contribution and scaling the float life contribution to account for an adjusted float voltage level applied during the first time period.

15. The apparatus of claim 11 wherein the first time period is a float time period and the life value module is a float life value module, the battery module is configured to monitor a float voltage applied to the battery during the first time period, and the float life value module is configured to monitor discharge of the battery during a third time period prior to the first time period, determine a discharge rate at which the battery was discharged during the third time period, and determine the first battery life decrement by determining a float life decrement based on the float voltage and the duration of the first time period, and scaling the float life decrement to account for the battery being discharged at the discharge rate during the third time period.

16. The apparatus of claim 15 wherein the float life module is further configured to reduce an effect that the scaling has on the float life contribution based on an amount of time that the third time period preceded the first time period.

17. The apparatus of claim 15 wherein the discharge event in the third time period is a most recent one of a plurality of discharge events that occurred prior to the first time period.

18. The apparatus of claim 15 wherein the float life module scales the float life decrement by applying a scale factor to the float life decrement, wherein a first scale factor for a first discharge rate results in a smaller scaled float life decrement for the first time period than does a second scale factor for a second discharge rate with the first discharge rate being lower than the second discharge rate.

19. The apparatus of claim 11 wherein the first time period is a discharge period, and the life value module is a cycle life value module, the battery monitor monitors discharge of the battery during the discharge period, and the cycle life value module is configured to determine, for the discharge period, a rate and/or depth of discharge of the battery, determine an estimated number of discharge cycles based on the discharge rate and/or the depth of discharge, and determine the first battery life decrement by determining a cycle life contribution for the first time period based on the estimated number of discharge cycles.

20. The apparatus of claim 11 further comprising: a state of health module configured to determine a capacity of the battery by performing a state of health test; wherein the remaining life module is further configured to adjust the remaining battery lifetime based on the determined capacity.

21. An apparatus for estimating battery lifetime, the apparatus comprising:

a battery monitor configured to monitor a float voltage applied to a battery during a first time period wherein the first time period corresponds to a float charge event and monitor a charge characteristic of the battery;

a float life value module coupled to the battery monitor and configured to monitor an operating condition of the battery wherein the operating condition depends on the float charge event monitored during the first time period, determine a first float life contribution based on the operating condition of the battery, the float voltage, and a duration of the first time period, and determine an overall float life value combining the first float life contribution and a second float life contribution for a second time period wherein the second time period corresponds to at least one float charge event prior to the float charge event of the first time period;

a cycle life value module coupled to the battery monitor and configured to determine, for a third time period wherein the third time period corresponds to a charge cycle event, a rate and/or depth of discharge of the battery, determine an estimated number of discharge cycles based on the discharge rate and/or the depth of discharge, determine a first cycle life contribution for the third time period based on the estimated number of discharge cycles, and determine an overall cycle life value combining the first cycle life contribution and a second cycle life contribution for a fourth time period wherein the fourth time period corresponds to at least one charge cycle event prior to the charge cycle event of the third time period; and a remaining life module coupled to the float life value module and the cycle life value module and configured to estimate a remaining battery lifetime for the battery based on the overall float life value and the overall cycle life value.

* * * * *